(12) United States Patent
Deak et al.

(10) Patent No.: US 11,287,490 B2
(45) Date of Patent: Mar. 29, 2022

(54) MAGNETORESISTIVE SENSOR WITH SENSING ELEMENTS AND PERMANENT MAGNET BARS ORIENTED AT NON-ORTHOGONAL AND NON-PARALLEL ANGLES WITH RESPECT TO THE SENSING DIRECTION OF THE SENSING ELEMENTS

(71) Applicant: Multidimension Technology Co., Ltd., Zhangjiagang (CN)

(72) Inventors: James Geza Deak, Zhangjiagang (CN); Insik Jin, Zhangjiagang (CN); Weifeng Shen, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 276 days.

(21) Appl. No.: 14/379,706

(22) PCT Filed: Feb. 19, 2013

(86) PCT No.: PCT/CN2013/071676
§ 371 (c)(1),
(2) Date: Aug. 19, 2014

(87) PCT Pub. No.: WO2013/123873
PCT Pub. Date: Aug. 29, 2013

(65) Prior Publication Data
US 2015/0091560 A1    Apr. 2, 2015

(30) Foreign Application Priority Data
Feb. 20, 2012    (CN) .............................. 201210037732

(51) Int. Cl.
*G01R 33/09*    (2006.01)
*H01L 43/08*    (2006.01)
*G01R 15/20*    (2006.01)

(52) U.S. Cl.
CPC .......... *G01R 33/093* (2013.01); *G01R 33/098* (2013.01); *H01L 43/08* (2013.01); *G01R 15/205* (2013.01)

(58) Field of Classification Search
CPC ...... G01R 33/06; G01R 33/09; G01R 33/091; G01R 33/093; G01R 33/095;
(Continued)

(56) References Cited

U.S. PATENT DOCUMENTS 6,326,782 B1 * 12/2001  Schroeder .............. G01B 7/004
                                                       324/207.21
7,170,724 B2    1/2007  Sato et al.
(Continued)

FOREIGN PATENT DOCUMENTS

CN    1497749 A    5/2004
CN    1755387 A    4/2006
(Continued)

OTHER PUBLICATIONS

English machine translation of the detailed description of CN102226835, obtained from the EPO Patent Office website (https://worldwide.espacenet.com/advancedSearch?locale=en_ep), obtained on Jan. 21, 2019.*
(Continued)

*Primary Examiner* — Jermele M Hollington
*Assistant Examiner* — Suresh K Rajaputra
(74) *Attorney, Agent, or Firm* — Schwegman Lundberg & Woessner, P.A.

(57) ABSTRACT

The present invention relates to a magnetoresistive sensor for measuring a magnetic field. A calculation of the sensitivity to external magnetic fields is provided, and it is shown to be related to the shape anisotropy of the magnetoresistive sensing elements. Moreover, it is shown that sensitivity may be made highest when the shape of the magnetoresistive
(Continued)

element is long parallel to the sensing axis, and a magnetic bias field strong enough to saturate the magnetoresistive element's magnetization, $H_{cross}$, is applied perpendicular to the sensing axis. A monolithic permanent magnet is provided to generate the $H_{cross}$ and it may be applied at an angle in order to counteract non-ideal fields along the sense axis direction. The high sensitivity magnetoresistive element can be used in many electrical form-factors. Six exemplary bridge configurations are described herein.

6 Claims, 19 Drawing Sheets

(58) Field of Classification Search
CPC .. G01R 33/096; G01R 33/098; G01R 15/205; H01L 43/00; H01L 43/08; H01L 43/10; G01D 5/145; G01D 5/147; G01B 7/003; B82Y 25/00; B82Y 10/00; G11B 5/3903
See application file for complete search history.

(56) References Cited

U.S. PATENT DOCUMENTS

| | | | |
|---|---|---|---|
| 7,360,302 | B2 | 4/2008 | Sato et al. |
| 7,362,548 | B2 | 4/2008 | Sato et al. |
| 7,589,939 | B2 | 9/2009 | Wakui et al. |
| 7,842,334 | B2 | 11/2010 | Wakui et al. |
| 8,933,523 | B2 | 1/2015 | Deak et al. |
| 2004/0080872 | A1* | 4/2004 | Sato ............... H01F 41/304 360/316 |
| 2006/0291106 | A1* | 12/2006 | Shoji ............... G01R 33/09 360/324.11 |
| 2008/0169807 | A1* | 7/2008 | Naito ............... B82Y 25/00 324/252 |
| 2008/0272771 | A1 | 11/2008 | Guo et al. |
| 2010/0079135 | A1* | 4/2010 | Ando ............... B82Y 25/00 324/207.11 |
| 2010/0253330 | A1* | 10/2010 | Sasaki ............... B82Y 25/00 324/252 |
| 2014/0035570 | A1* | 2/2014 | Jin ............... G01R 33/098 324/252 |
| 2014/0035573 | A1 | 2/2014 | Deak et al. |
| 2014/0327437 | A1* | 11/2014 | Han ............... G01R 17/10 324/252 |
| 2015/0130455 | A1 | 5/2015 | Bai et al. |

FOREIGN PATENT DOCUMENTS

| | | | | |
|---|---|---|---|---|
| CN | 102226835 | A | | 10/2011 |
| CN | 202013413 | U | * | 10/2011 ............. H01L 27/22 |
| CN | 102419393 | A | * | 4/2012 ............. G01R 19/32 |
| CN | 102565727 | A | | 7/2012 |
| CN | 102590768 | A | | 7/2012 |
| CN | 102540112 | A | | 8/2012 |
| CN | 102621504 | A | | 8/2012 |
| CN | 202494772 | U | | 10/2012 |
| EP | 2818884 | A1 | | 12/2014 |
| JP | H11288504 | | | 10/1999 |
| JP | 2001345498 | | | 12/2001 |
| JP | 2003152244 | | | 5/2003 |
| JP | 2003215222 | | | 7/2003 |
| JP | 2007003498 | | | 1/2007 |
| JP | 2007064692 | | | 3/2007 |
| JP | 2008134181 | | | 6/2008 |
| JP | 2008525787 | | | 7/2008 |
| JP | 2009527758 | | | 7/2009 |
| JP | 2009-180596 | A | | 8/2009 |
| JP | 2009281784 | | | 12/2009 |
| JP | 2011196798 | | | 10/2011 |
| JP | 2015513667 | A | | 5/2015 |
| WO | WO-2011/074488 | A1 | | 6/2011 |
| WO | WO-2013/123873 | A1 | | 8/2013 |

OTHER PUBLICATIONS

Partial English translation of CN102226835, obtained from proquest.com, obtained on Sep. 24, 2019.*
"International Application Serial No. PCT/CN2013/071676, International Preliminary Report on Patentability dated Aug. 26, 2014", (w/ English Translation), 28 pgs.
"International Application Serial No. PCT/CN2013/071676, International Search Report dated May 23, 2013", (w/ English Translation), 9 pgs.
"International Application Serial No. PCT/CN2013/071676, Wrritten Opinion dated May 23, 2013", (w/ English Translation), 26 pgs.
"European Application No. 13751243.0, Extended European Search Report dated Jan. 18, 2016", (Jan. 18, 2016), 13 pgs.
"Japanese Application No. 2014-557985, Search Report dated Sep. 6, 2016", (Sep. 6, 2016), 42 pgs.

* cited by examiner

MAGNETORESISTIVE SENSOR WITH SENSING ELEMENTS AND PERMANENT MAGNET BARS ORIENTED AT NON-ORTHOGONAL AND NON-PARALLEL ANGLES WITH RESPECT TO THE SENSING DIRECTION OF THE SENSING ELEMENTS

CROSS-REFERENCE TO A RELATED APPLICATION

This application is a 35 U.S.C. § 371 national phase application of PCT/CN2013/071676, filed on Feb. 19, 2013, which claims priority to a Chinese Patent Application No. CN 20120037732.9, filed on Feb. 20, 2012, incorporated herein by reference in its entirety.

FIELD OF THE INVENTION

The invention relates to sensors for magnetic field detection, more specifically to magnetoresistive magnetic field sensors.

BACKGROUND OF THE INVENTION

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to offset in the magnetoresistive response of MTJ sensors, and difficulty in matching the magnetoresistive response of MTJ elements when combined to form bridge sensors have proven difficult.

The magnetoresistive element response that is used in sensors is a function of the orientation of the magnetization of one or more sensing layers within a stack of the sensing materials. Obtaining a desirable magnetic sensing often requires applying magnetic fields to magnetically "bias" the magnetization to a sensitive yet stable operating point. These "biasing fields" have, in the past, required using external coils or permanent magnets that are undesirable from a power, cost, and size standpoint.

SUMMARY OF THE INVENTION

In order to solve these problems, the present invention provides a magnetic design and manufacturing method for mass production of linear magnetoresistive sensor bridges using standard semiconductor manufacturing processes.

The present invention discloses a magnetic field sensor comprising: A substrate in the X—Y plane, wherein the X and Y axes are perpendicular, and a magnetoresistive sensor senses the magnetic field along the Y-axis. At least one sensing arm in the XY plane that includes a magnetoresistive sensor element with long dimension parallel to the Y-axis and the width direction parallel to the X-axis. At least one pair of elongated permanent magnet bars on the substrate generating a bias magnetic field with a component along the X-axis and a component along Y-axis. And, wire bond pad on the substrate electrically connected to each side of the sensing arms.

Preferably, the magnetoresistive sensor element is saturated along the X-axis by the biasing field.

Preferably the magnetoresistive transfer curve of the MR sensor elements has high linearity, high sensitivity, and low hysteresis in response to a magnetic field applied in the working magnetic field range of the magnetoresistive sensor.

Preferably, the magnetoresistive sensor's transfer curve is adjusted by controlling the magnetization magnitude and direction of the one or more pairs of elongated permanent magnet bars.

Preferably, the magnetoresistive sensor element is a MTJ or GMR element.

Preferably, the magnetoresistive sensor is a bridge sensor.

Preferably, the bridge sensor is a push-pull full-bridge sensor.

Preferably, the push-pull full-bridge sensor includes four sensing arms, wherein the resistance as a function of magnetic field transfer curves of two of the four sensing arms change inversely with respect to with those of the other two in response to the same applied magnetic field within the working magnetic field range of the magnetoresistive sensor.

Preferably, the push-pull full-bridge sensor comprises two sensor dice cut from the same wafer, wherein each die has a surface parallel to the X-Y plane which contains two sensing arms, and the two dice are rotated 180 degrees with respect to each other.

Preferably, the sensing arms are electrically interconnected by wire-bonding to the bond pads.

Preferably, the bridge sensor is a referenced full-bridge sensor including a sensing arm and a reference arm, wherein the reference arm comprises a magnetoresistive sensor element.

Preferably, the referenced full-bridge sensor comprises two sensing arms and two reference arms, wherein in slopes of the resistance as a function of applied magnetic field response of the sensing arms are much greater those of the reference arms within the working magnetic field range of the magnetoresistive sensor.

Preferably, the referenced full-bridge sensor comprises one sensor die, including a substrate with surface parallel to the X-Y plane on which magnetoresistive sensor elements that constitute both the reference arms and sensing arms are situated.

Preferably, the length of the reference arm magnetoresistive element along the X-axis is longer than length of the reference arm magnetoresistive element along the Y-axis and longer than the length of the sensing arm magnetoresistive element along the X-axis.

Preferably, the magnetoresistive sensor elements of the reference arm are shielded by a high permeability ferromagnetic layer.

Preferably, the X-axis component of the magnetic field generated by a pair of the elongated permanent magnetic bars adjacent to the reference arm is greater than that the X-axis component of the magnetic field generated by a pair of the elongated permanent magnetic bars adjacent to the sensing arm.

Preferably, the magnetoresistive sensor element of the reference arm or the magnetoresistive sensor element of the sensing arm is covered by one or more than one permanent magnetic biasing layers.

Preferably, the magnetoresistive sensor elements of the reference arm are covered by a single layered or multilayered exchange bias coupling layer.

Preferably, the bridge sensor is a push-pull half-bridge sensor including two sensing arms.

Preferably, the push-pull half-bridge sensor includes two sensing arms, wherein the resistance as a function of applied magnetic field transfer curves of one of the two sensing arms changes inversely with respect to with that of the other one in response to the same applied magnetic field within the working magnetic field range of the magnetoresistive sensor.

Preferably, the push-pull half-bridge sensor comprises two sensor dice cut from the same wafer, wherein each die has a surface parallel to the X-Y plane which contains one sensing arms, and the two dice are rotated 180 degrees with respect to each other.

Preferably, the sensing arms are electrically interconnected by wire-bonding to the bond pads.

Preferably, the bridge sensor is a referenced half-bridge sensor including a sensing arm and a reference arm, wherein the reference arm comprises a magnetoresistive sensor element.

Preferably, the referenced half-bridge sensor comprises one sensing arm and one reference arm, wherein in slopes of the resistance as a function of applied magnetic field response of the sensing arm is much greater that of the reference arm within the working magnetic field range of the magnetoresistive sensor.

Preferably, the referenced half-bridge sensor comprises one sensor die, including a substrate with surface parallel to the X-Y plane on which magnetoresistive sensor elements that constitute the reference arm and sensing arm are situated.

Preferably, the length of the magnetoresistive sensor element of the reference arm along the X-axis is longer than that along the Y-axis, and that of the magnetoresistive sensor element of the sensing arm along the X-axis.

Preferably, the magnetoresistive sensor elements of the reference arm are shielded by a high permeability ferromagnetic layer.

Preferably, the X-axis component of the magnetic field generated by a pair of the elongated permanent magnetic bars adjacent to the reference arm is greater than that the X-axis component of the magnetic field generated by a pair of the elongated permanent magnetic bars adjacent to the sensing arm.

Preferably, the magnetoresistive sensor element of the reference arm and the magnetoresistive sensor element of the sensing arm is covered by one or more than one permanent magnetic biasing layers.

Preferably, the magnetoresistive sensor elements of the reference arm are covered by a single layered or multilayered exchange bias coupling layer.

Preferably, the magnetoresistive sensor is a push-pull quasi-full-bridge sensor comprising two independent electrical current sources and two sensing arms.

Preferably, wherein the resistance as a function of applied magnetic field transfer curves of one of the two sensing arms changes inversely with respect to with that of the other one in response to the same applied magnetic field within the working magnetic field range of the magnetoresistive sensor.

Preferably, the push-pull quasi-full-bridge sensor comprises two sensor dice cut from the same wafer, wherein each die has a surface parallel to the X-Y plane which contains one sensing arms, and the two dice are rotated 180 degrees with respect to each other.

Preferably, the sensing arms are electrically interconnected by wire-bonding to the bond pads.

Preferably, the magnetoresistive sensor is a referenced quasi-full-bridge sensor comprising two independent electrical current sources, one sensing arm, and one reference arm.

Preferably, the slope of the resistance as a function of applied magnetic field response of the sensing arm is much greater than that of the reference arm within the working magnetic field range of the magnetoresistive sensor.

Preferably, the referenced quasi-full-bridge sensor comprises one sensor die, including a substrate with surface parallel to the X-Y plane, on which the magnetoresistive sensor elements that constitute referenced arms and sensing arms situated.

Preferably, the length of the magnetoresistive sensor element of the reference arm along the X-axis is longer than that along the Y-axis, and that of the magnetoresistive sensor element of the sensing arm along the X-axis.

Preferably, the magnetoresistive sensor elements of the reference arm are shielded by a high permeability ferromagnetic layer.

Preferably, the X-axis component of the magnetic field generated by a pair of the elongated permanent magnetic bars adjacent to the reference arm is greater than that the X-axis component of the magnetic field generated by a pair of the elongated permanent magnetic bars adjacent to the sensing arm.

Preferably, the magnetoresistive sensor element of the reference arm and the magnetoresistive sensor element of the sensing arm is covered by one or more than one permanent magnetic biasing layers.

Preferably, the magnetoresistive sensor elements of the reference arm are covered by a single layered or multilayered exchange bias coupling layer.

The present invention adapts standard semiconductor manufacturing technology for use in the mass production of linear magnetoresistive sensor bridges. The resulting sensor bridges have high sensitivity resulting from the use of magnetic tunnel junction (MTJ) or giant magnetoresistance (GMR) multilayer films. They also contain set on-chip permanent magnets used to bias the sensor elements and compensate for offset. High sensitivity can be achieved when the permanent magnet bias field perpendicular to the sensing direction balances the internal shape and material anisotropy fields, and low offset results when a component of the magnetic bias field is directed along the sensing axis. As a result of these innovations, a high sensitivity magnetoresistive sensor bridge can be built that has low drift, high linearity, and good temperature stability, which will increase the number of practical applications for magnetoresistive sensor bridges.

SPECIFIC EMBODIMENTS

Figure 1:
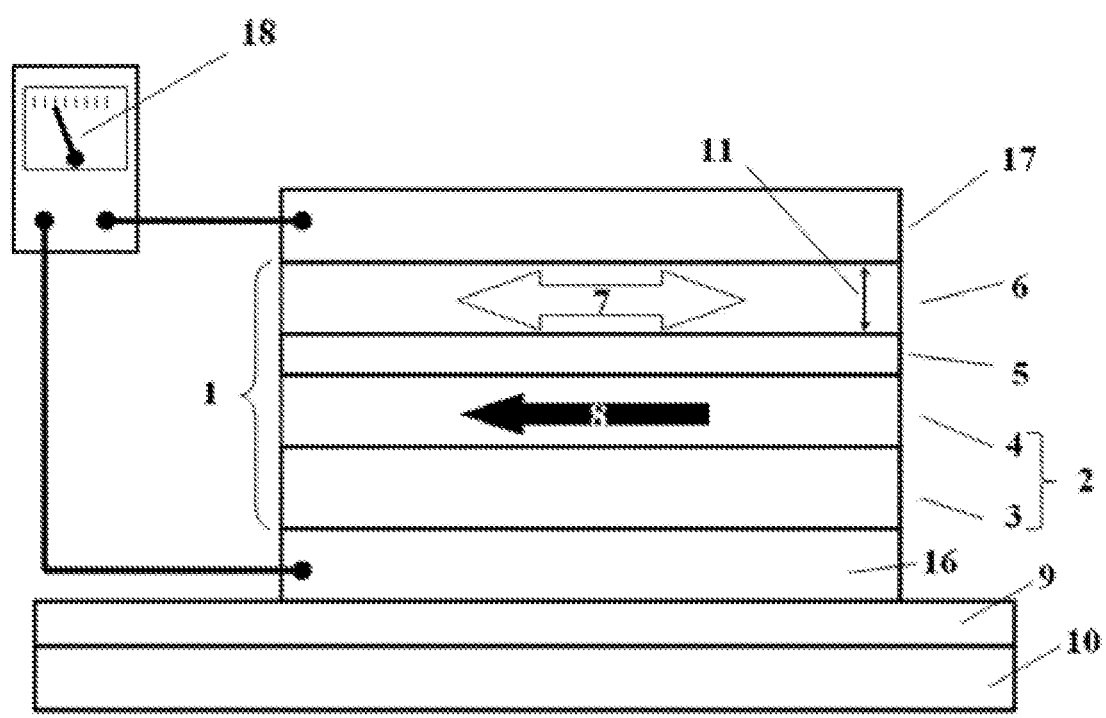
FIG. 1—A schematic diagram of a magnetic tunnel junction (MTJ) cross section, wherein the top and bottom leads of the MTJ element are connected to an ohmmeter, which measures the resistance vale of the MTJ.

A schematic of the construction and electrical measurement of the resistance of a Magnetic Tunnel Junctions (MTJ) is shown in FIG. 1. MTJ stack, 1, consists of a ferromagnetic layer 4, and pinning layer 3, which can be an antiferromagnet; these are magnetically coupled together to form the pinned magnetic layer, 2. Tunnel barrier, 5, made of MgO or $Al_2O_3$; is formed directly on top of the ferromagnetic layer 4. The ferromagnetic layer, 6, is formed on top of barrier 5. The orientation of "pinned" layer magnetization vector, 8, and "sensing" layer magnetization vector, 7, are indicated by the direction of their arrows. The orientation of pinned layer magnetization vector 8 is designed to be relatively fixed in the presence of modest size magnetic fields. The orientation of sensing layer magnetization vector 7 is designed to be relatively "free" to rotate compared to that of the fixed layer. This rotational freedom is indicated by the double-ended arrow 7 in contrast to the single ended arrow 8. Typical thicknesses of layers 3, 4, 5, and 6 are 0.1 nm to 100 nm.

Bottom and top electrodes, 16 and 17, are in direct electrical contact with their respective layers 3 and 6. The electrodes are usually a non magnetic conductive metal, and must be suitable for carrying electrical current to the inputs to Ohmmeter 18. The ohmmeter applies a known electric current potential (or voltage) across the entire stack, and measures the resulting electrical voltage (or current) that results. Ordinarily, the tunnel barrier 5 is the majority of the resistance in such a device, say 1,000 ohms and all of the rest of the lead resistance is 10 ohms. Bottom conducting layer, 16, is supported by an insulating substrate material, 9, whose edges extend beyond those of layer 16. Insulating substrate material 9 may, in turn, be supported by other body substrate materials, 10. The body substrate materials are most commonly silicon, but can be glass, pyrex, GaAs, AlTiC, or any other material that provides adequate wafer integrity. Silicon is prized for its ease of processing into circuits, though such circuits are not always needed for magnetic sensors.

Figure 2:
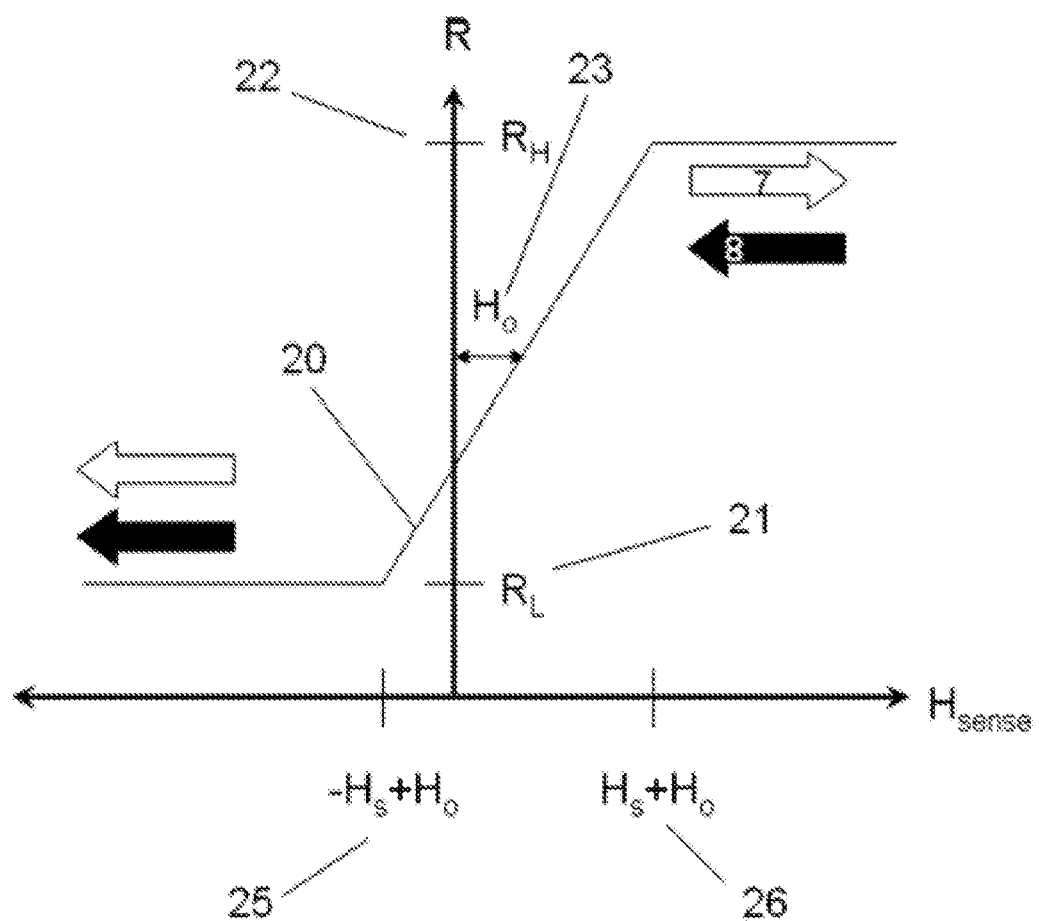
FIG. 2—Schematic drawing of the magnetoresistive response of a spin-valve sensing element with the reference layer magnetization pointing in the negative H direction.

The general form of the magnetoresistive (MR) transfer curve [that is, a plot of Resistance vs. Applied Magnetic Field] of a GMR or MTJ magnetic sensor element suitable for linear magnetic field measurement is shown schematically in FIG. 2. The transfer curve, 20, depicted in the figure, saturates at low 21 and high 22 resistance values, $R_L$ and $R_H$, respectively. In the region between saturation, the transfer curve is linearly dependent on the applied magnetic field, H, or $H_{sense}$. The applied field $H_{sense}$ is applied parallel to the Sense Axis of the sensor element. Pinned layer magnetization layer, 8, is antiparallel to the Sense Axis meaning that it is pointed in the −H direction. The resistance curve, 20, has its largest value when free layer magnetization vector, 7, is antiparallel to that of the pinned layer, 8; and its smallest value when parallel to 8. Intermediate values of the resistance curve, 20, are obtained for free layer 6 and pinning layer 4 magnetization angles are at an intermediate angle. The transfer curves 20 need not be symmetric about the H=0 point in the plots. The saturation fields 25, 26 are typically offset by an amount $H_o$, 23 such that the $R_L$ saturation region is closer to the H=0 point. The value of $H_o$, is often referred to as "orange peel" or "Neel coupling," and it typically ranges from 1 to 40 Oe. It is related to roughness of the ferromagnetic films within the MR structures, and it is dependent on materials and manufacturing processes.

As shown in FIG. 2, between saturation fields 25 and 26, and for the purpose of illustrating device operation, the working region of the transfer curve may be approximated as:

$$R(H) = \frac{R_H - R_L}{2H_s}(H - H_o) + \frac{R_H + R_L}{2} \quad (1)$$

where $H_s$ is the saturation field. $H_s$ is quantitatively defined as the fields at which the low-field transfer curve tangent intersects the positive and negative saturation tangents, respectively after shifting the curve by $H_o$ to remove asymmetry.

The transfer curve 20 in FIG. 2 is idealized in several ways. One way is that it shows a completely linear relationship between Resistance, R and Applied Magnetic Field, $H_{sense}$, and no magnetic hysteresis. In actual cases, the magnetic resistance response curve changing with field has the lag phenomenon, we call it a hysteresis. When the magnetic field is applied cyclically, the transfer curve for ferromagnetic materials used in magnetoresistive devices shows a time lag phenomenon or opening of the loop, known as hysteresis. When properly optimized, however, the effect can be small and the transfer curves can be regarded as perfectly linear. In real sensors, however, there are magnetic design constraints and material imperfections that make the transfer curve 20 more curved. The present invention relates to designs, structures, and processes that, when implemented in a real product, deliver excellent sensing operation.

Figure 3:
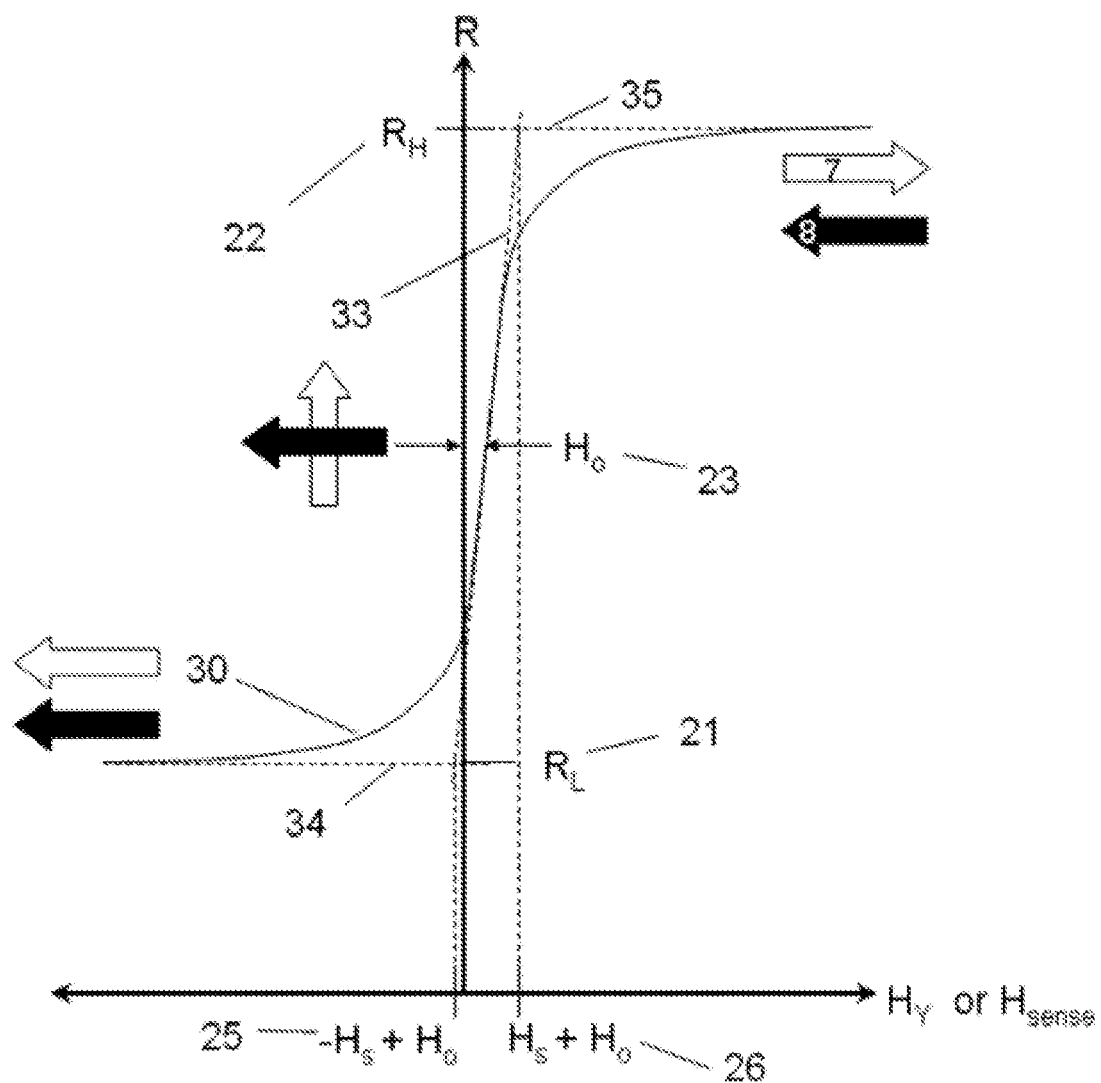
FIG. 3—Exemplary Resistance vs. Applied Magnetic Field curve for a High Sensitivity MTJ element.
Figure 4:
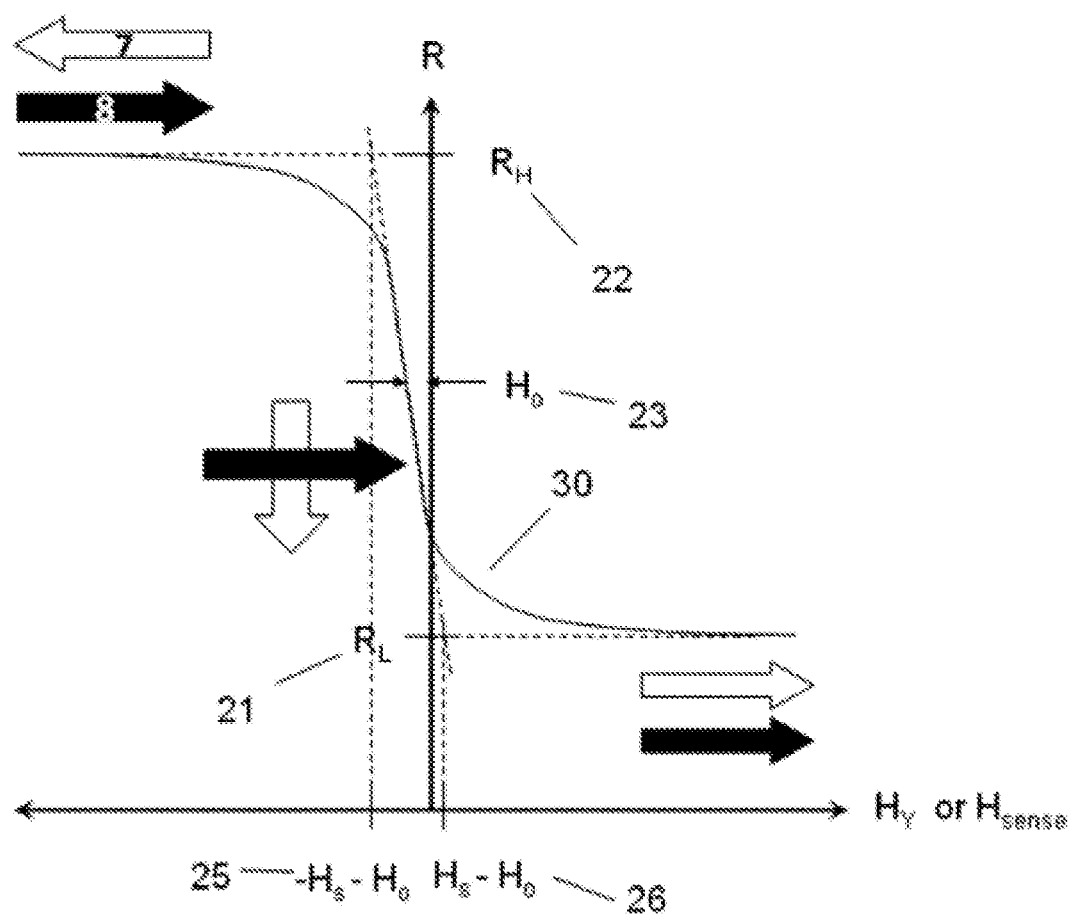
FIG. 4—is an exemplary resistance vs. Applied Magnetic Field response curve for a die which is rotated by 180 degrees (flipped die).

Transfer curve, 30, plotting R vs. $H_{sense}$, has a low, $R_L$, and high, $R_H$, resistance values, 21 and 22, respectively. It is highly sensitive centered in the region at and near zero field, roughly in an area about ⅓ of the area between high and low saturation, 25 and 26 respectively. The H=0 tangent to curve 30 is plotted as tangent line 33. The slope of this line is directly proportional to the sensitivity of the sensor. Zero field tangent line 33 intersects low field tangent line 34, and high field tangent line 35, at magnetic field values $(-H_s+H_o)$, 25, and $(+H_s+H_o)$, 26, respectively. As shown in FIG. 3, the highest and lowest resistance values on curve 30 occur when magnetization orientations 7 and 8 are antiparallel, and parallel, respectively. The resistance value when 7 and 8 are perpendicular is halfway between $R_L$ and $R_H$. This is an ideal "operating point" for a linear magnetic sensor. As shown in FIG. 4 the R vs. $H_{sense}$ curve for the same die (the substrate material is sawn into many dice, each die containing a single device) that has been rotated by 180 degrees about the axis normal to the sensor plane. The pinned layer magnetization orientation, 8, now is parallel to $H_{sense}$ rather than antiparallel as in the main plot. In this way, the slope of the R vs. $H_{sense}$ curve becomes exactly negative of that for a non-rotated die in the same $H_{sense}$. This fact proves to be useful for creating resistance bridges with greater output than would otherwise be possible.

Figure 5:
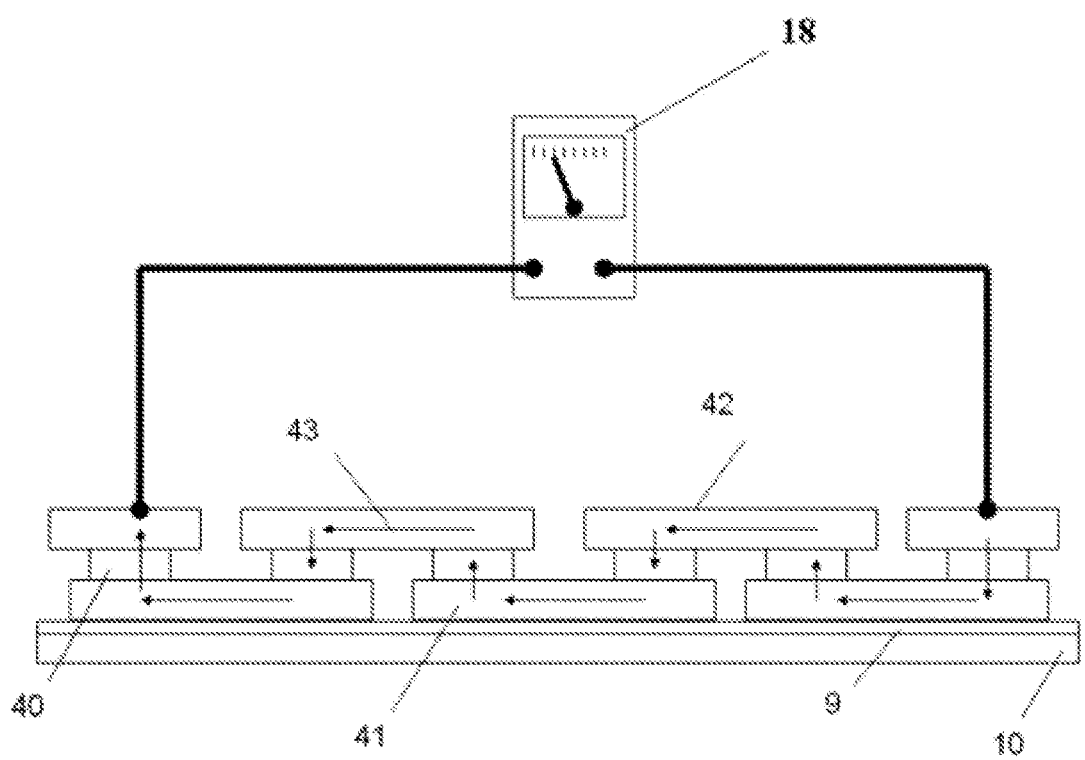
FIG. 5—A schematic drawing showing method for combining a plurality of MTJ elements into a single magnetoresistive element.

Because of their small size, MTJ elements can be connected together in a string in order to increase sensitivity, reduce 1/F noise, and improve resistance to electrostatic discharge as shown in FIG. 5. This string can serve as a magnetoresistive arm of a more complex circuit. The MTJ elements 40 are sandwiched between bottom 41 and top 42 electrodes, and interconnected such that the current 43 flows vertically through the MTJ 40 and horizontally through alternating conductors patterned from the top and bottom conducting layers. Bottom electrode 41 is supported on insulating layer 9 and possibly additional substrate body 10. At the end of the string of each element is a bonding pad, to which other components or ohmmeter 18 may be connected to other parts of the circuit. The direction of current flow normally does not affect the resistance value of the bridge arm. It is advantageous to keep the same size MTJ junctions in the reference and sensor arms of the bridge, because it makes the device less sensitive to etch bias during fabrication, so a further advantage of these strings of MTJ elements is the number of elements in each string can be varied in order to set the optimal resistance ratio between the reference and sensor arms of the bridge.

Electrical Bridges are used in converting the signal from resistance transducers to an easily amplified voltage. This is to improve signal to noise, cancel common mode signals, reduce thermal effects, and many other reasons. The strings of MR elements described above can easily be connected together to form a Wheatstone bride or related variations of that bridge.

Figure 6:
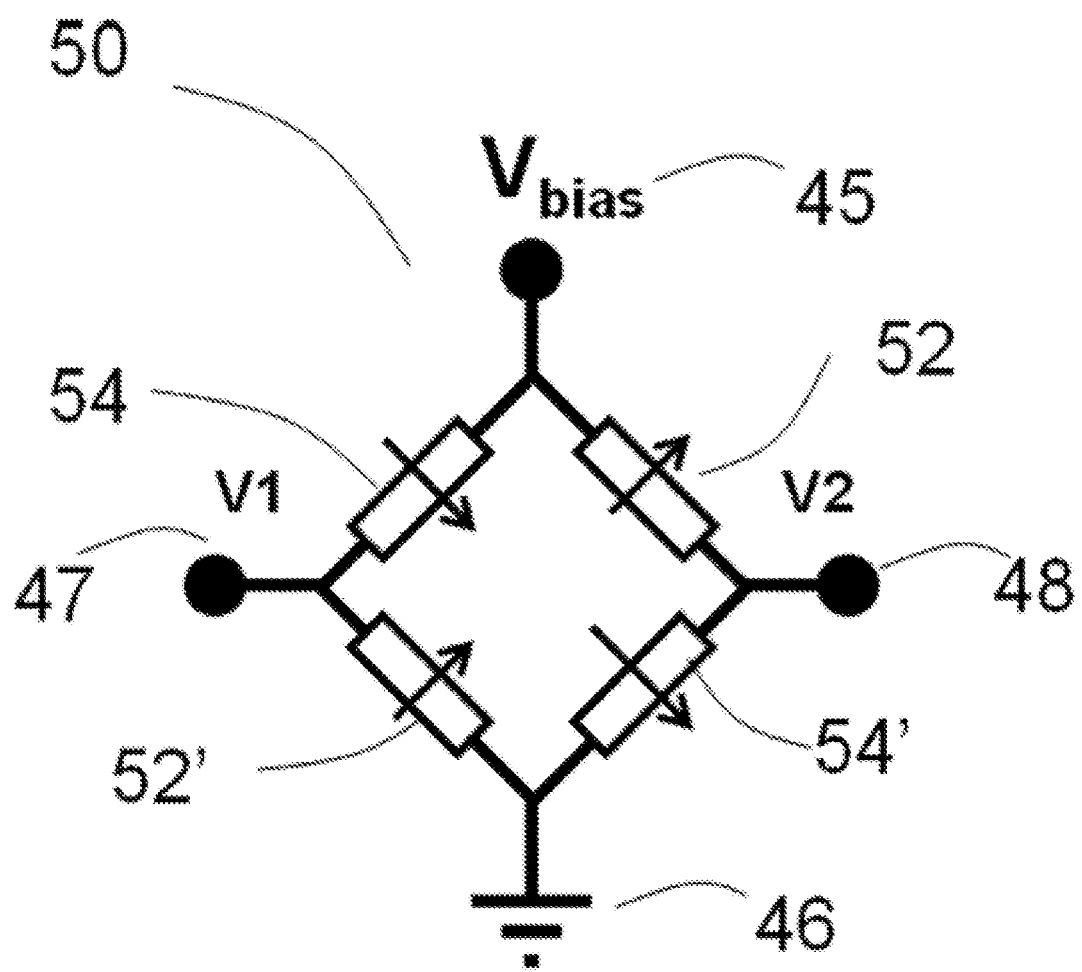
FIG. 6 shows a push-pull full-bridge sensor circuit.

FIG. 6 shows a schematic diagram of a push-pull full-bridge sensor. The push-pull magnetic field sensor includes four full-bridge sensor arms, wherein the magnetoresistance of two arms of the bridge within the working range of the sensor change in opposition to the other two arms of the bridge in response to the same applied field.

The push-pull full-bridge magnetic field sensor comprises two sensor dice cut from the same wafer, wherein each die has a surface parallel to the X-Y plane which contains two sensing arms, and the two dice are rotated 180 degrees with respect to each other.

The sensing arms are electrically interconnected by wire-bonding to the bond pads.

Figure 7:
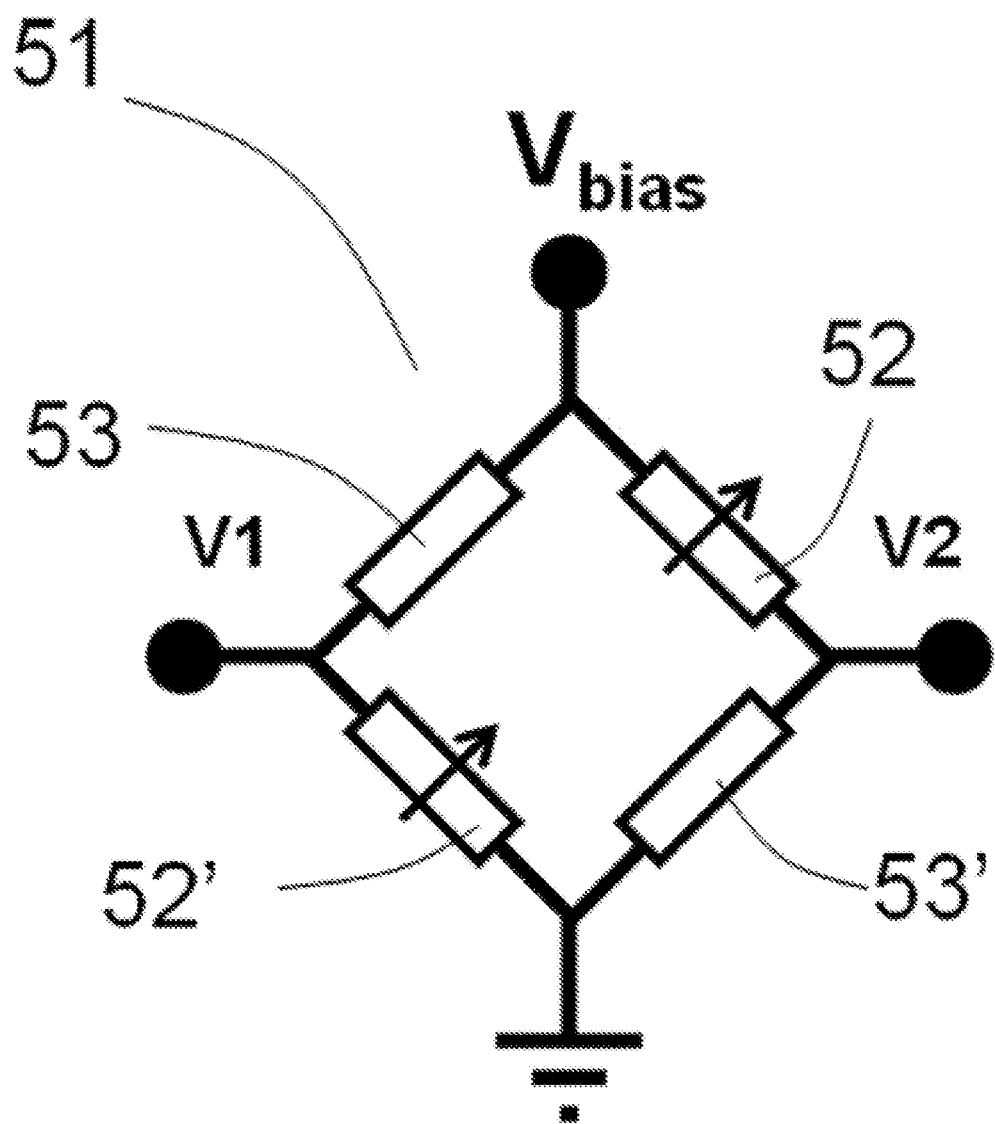
FIG. 7 shows a referenced full-bridge sensor circuit.

FIG. 7 is a schematic diagram of a referenced full-bridge sensor.

The referenced full-bridge sensor configured as a magnetic field sensor comprises two sensing arms and two reference arms, wherein the reference and sensor arms are comprised of magnetoresistive sensor elements.

The referenced full-bridge sensor comprises two sensing arms and two reference arms, wherein the slopes of the resistance as a function of applied magnetic field response of the sensing arms are much greater those of the reference arms within the working range of the magnetoresistive sensor.

The referenced full-bridge sensor comprises one sensor die, including a substrate with surface parallel to the X-Y plane on which magnetoresistive sensor elements that constitute both the reference arms and sensing arms are situated.

Figure 8:
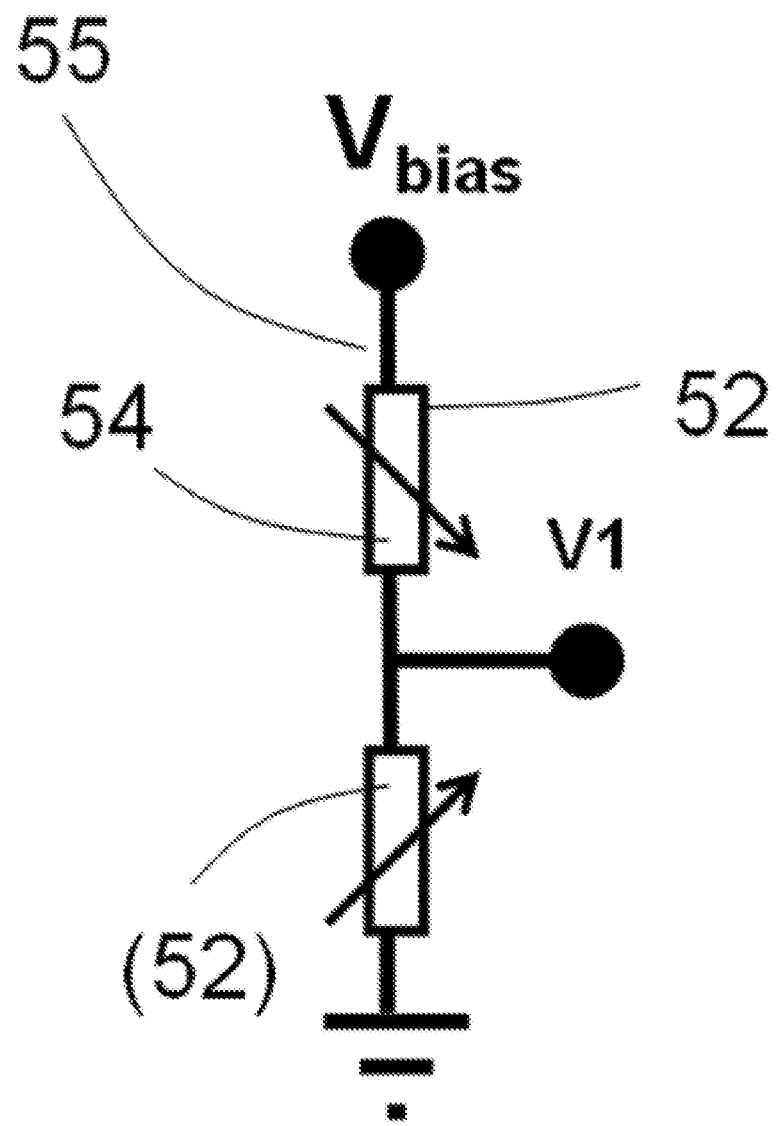
FIG. 8 shows a push-pull half-bridge sensor circuit.

FIG. 8 shows a schematic diagram of a push-pull half-bridge sensor circuit.

The push-pull half-bridge sensor configured as a magnetic field sensor includes two sensing arms.

The push-pull half-bridge magnetic field sensor includes two sensing arms, wherein the resistance as a function of applied magnetic field transfer curve of one of the two sensing arms changes inversely with respect to that of the other one in response to the same applied magnetic field within the working magnetic field range of the magnetoresistive sensor.

The push-pull half-bridge magnetic field sensor comprises two sensor dice cut from the same wafer, wherein each die has a surface parallel to the X-Y plane which contains one sensing arm, and the two dice are rotated 180 degrees with respect to each other.

The sensing arms of the push-pull half-bridge magnetic field sensor are electrically interconnected by wire-bonding to on-chip bond pads.

Figure 9:
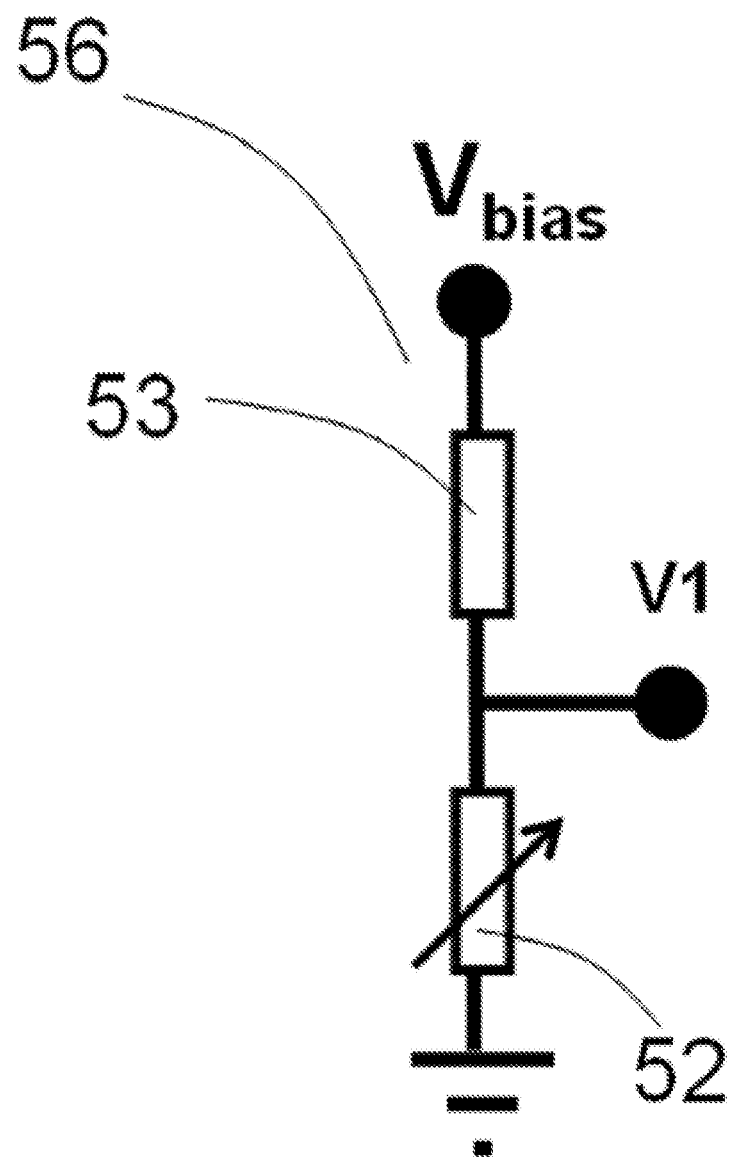
FIG. 9 shows a referenced half-bridge sensor circuit.

FIG. 9 shows the schematic diagram of a referenced half-bridge circuit.

When the referenced half-bridge circuit is configured as a referenced half-bridge magnetic field sensor, it includes a sensing arm and a reference arm, where the sensing and reference arms are composed of magnetoresistive elements.

The referenced half-bridge magnetic field sensor comprises one sensing arm and one reference arm, wherein in slopes of the resistance as a function of applied magnetic field response of the sensing arm is much greater that of the reference arm within the working range of the magnetoresistive sensor.

The referenced half-bridge magnetic field sensor comprises one sensor die, including a substrate with surface parallel to the X-Y plane on which magnetoresistive sensor elements that constitute the reference arm and the sensing arm are situated.

Figure 10:
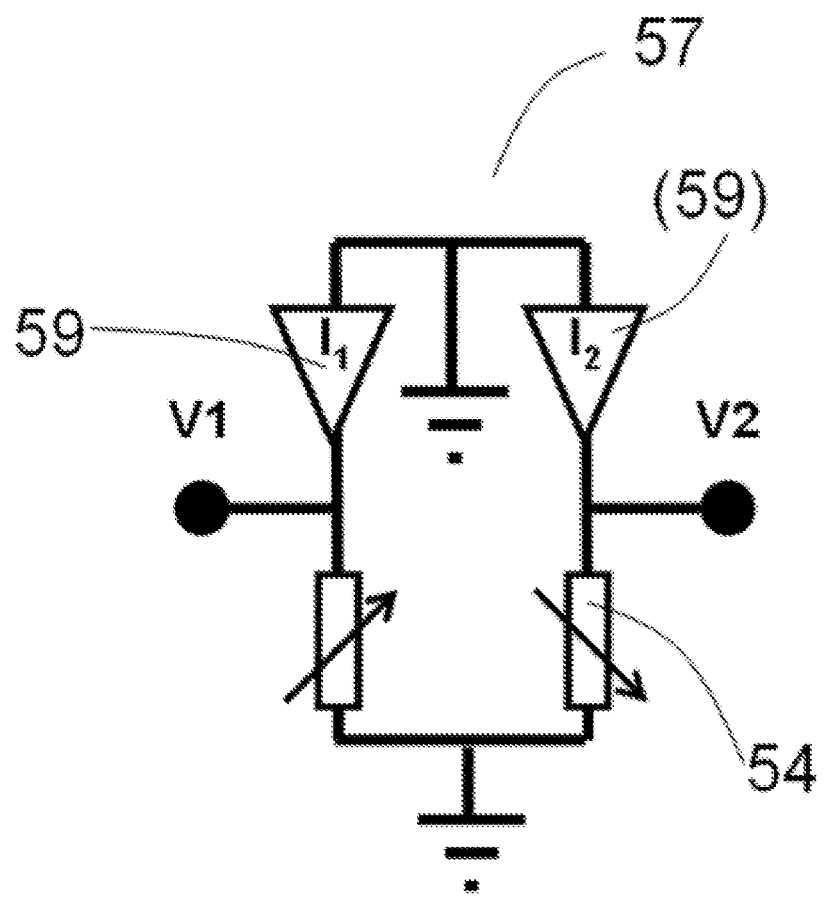
FIG. 10 shows a push-pull quasi-full-bridge sensor circuit.

FIG. 10 illustrates a schematic diagram of a quasi-full-bridge circuit.

Configured as a quasi-full-bridge magnetic field sensor, the push-pull quasi-full-bridge comprises two independent electrical current sources and two sensing arms.

In the quasi-full-bridge magnetic field sensor, the resistance as a function of applied magnetic field transfer curves of one of the two sensing arms changes inversely with respect to with that of the other one in response to the same applied magnetic field.

The push-pull quasi-full-bridge magnetic field sensor comprises two sensor dice cut from the same wafer, wherein each die has a surface parallel to the X-Y plane which contains one sensing arms, and the two dice are rotated 180 degrees with respect to each other.

The sensing arms of the push-pull quasi-full-bridge magnetic field sensor are electrically interconnected by wire-bonding to the bond pads.

Figure 11:
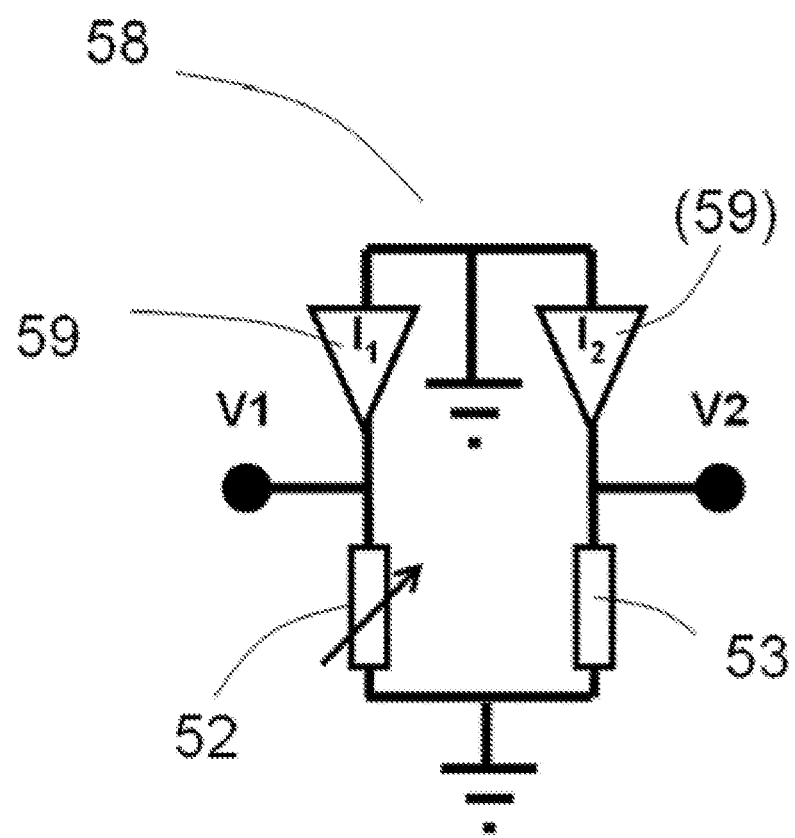
FIG. 11 shows a referenced quasi-full-bridge sensor circuit.

FIG. 11 illustrates a schematic diagram of a quasi-full-bridge circuit.

Configured as a quasi-full-bridge referenced magnetic field sensor, the quasi-full-bridge sensor comprises two independent electrical current sources one sensing arm and one reference arm.

The slope of the resistance as a function of applied magnetic field response of the sensing arm is much greater than that of the reference arm within the working range of the magnetoresistive sensor.

The referenced quasi-full-bridge sensor comprises one sensor die, including a substrate with surface parallel to the X-Y plane, on which the magnetoresistive sensor elements that constitute referenced arms and sensing arms situated.

One preferred variation is the "Full Bridge", 50, which has all four of its resistance arms actively responding to $H_{sense}$; such arms are called "sensing arms." Bonding pads are necessary to connect the ends of the sensors. For clarity the bonding pads are not illustrated. Sensing arms 52 and 52' have a positive slope for their R vs. $H_{sense}$ curve; sensing arms 54 and 54' have a negative slope for their R vs. $H_{sense}$ curve. The direction of the arrows over sensing arms 52 and 54 is suggestive of the sign of the slope of their respective Resistance vs. Applied Magnetic Field curves.

Starting from the top and moving around the circumference of the diamond shaped push-pull full-bridge magnetic field sensor 50, the sensors need contact pads for voltage bias ($V_{bias}$ 45), half-bridge center-tap (V2,48), ground (GND, 46), and half bridge center-tap ($V_1$, 47). The sense arms may be prepared on an insulating layer 9 on a substrate 10. There are many ways to connect the bridge arm and external solder bridge. Typical connection structure includes: fully-integrated on an integrated circuit, wire bonding, and solder ball connection.

To derive this curve from the $R_H$ and $R_L$ values of curve 30 in FIG. 3, first calculate the voltage difference $V_1-V_2$ for $H_{sense}$ highly positive. In this sense condition, the value of sensing arms (52, 52'), and (54, 54') are $R_H$ and $R_L$, respectively. The net resistance of the bridge from $V_{bias}$ to GND is:

$$R_{net}=[R_H+R_L]\text{parallel}[R_L+R_H]=[R_L+R_H]/2. \quad (2)$$

Since the left and right sides of the bridge have equal resistance values, the electrical current flowing through the bridge is split equally between right and left sides of the bridge.

$$I_{left}=I_{right}=\frac{1}{2}\frac{V_{bias}}{[R_L+R_H]/2}=\frac{V_{bias}}{[R_L+R_H]}. \quad (3)$$

The voltage at $V_1$ on the left side is $$V_1 = R_H \cdot I_{left} = R_H \cdot \frac{V_{bias}}{[R_L+R_H]}. \quad (4)$$

The voltage at $V_2$ on the right side is $$V_2 = R_H \cdot I_{right} = R_L \cdot \frac{V_{bias}}{[R_L+R_H]}. \quad (5)$$

The output of the bridge sensor is defined as the difference between these:

$$V_{OUT} = V_1 - V_2 = R_H \cdot I_{right} = \frac{[R_H-R_L]}{[R_L+R_H]} \cdot V_{bias}. \quad (6)$$

So, this is the highest V output value for positive $H_{sense}$, shown as $+V_{peak}$, 61, on FIG. 6. One can see by visual inspection that the tangent line, 63, passes through the origin and intersects the $+V_{peak}$ value 61 at $H_{sense}=H_{sat}$. So, the Bridge Output Voltage Sensitivity, defined by the slope of the Bridge Output at H=zero is:

$$S = \left(\frac{R_H-R_L}{R_H+R_L}\right)\frac{V_{bias}}{H_{Sat}}. \quad (7)$$

Figure 12:
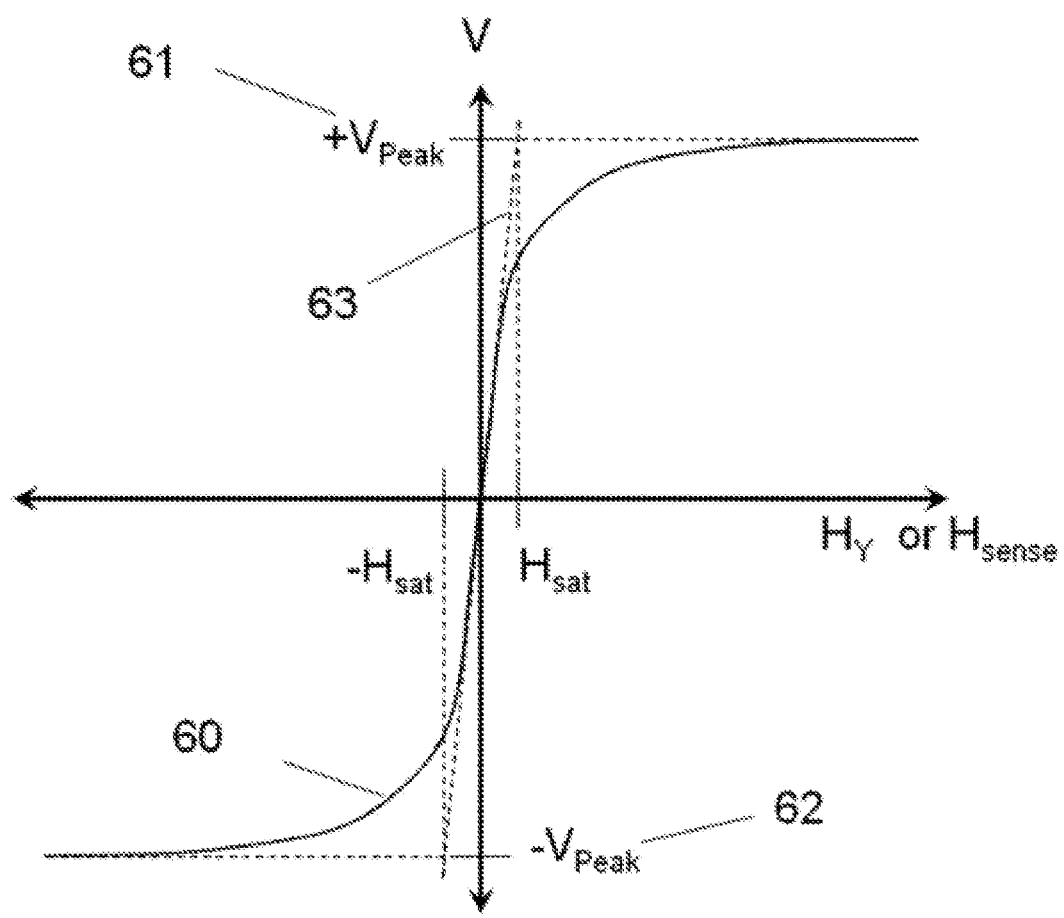
FIG. 12—Exemplary plot of Bridge Voltage Output vs. Applied Magnetic Field curve for a Full Bridge having four High Sensitivity MTJ sensing arms in a "push-pull flipped die" arrangement.

It will be shown later that $$H_{Sat}=H_{Cross}-H_k \quad (8)$$

where $H_{cross}$ is a field applied perpendicular to the sense direction and in the sensor chip plane for the purpose of magnetically "biasing" the magnetization of sensing free layer 7; $H_k$ is the Net Effective Uniaxial Anisotropy Field of layer 7. $H_k$ can be measured using independent methods such as a Vibrating Sample Magnetometer (VSM) or Superconducting Quantum Interference Device (SQUID) Magnetometer. For now we substitute Eqn. 8 without proof into Eqn. 7 to get the Sensitivity of $V_{out}$ vs. $H_{sense}$ in FIG. 12:

$$S = \left(\frac{R_H-R_L}{R_H+R_L}\right)\frac{V_{bias}}{H_{cross}-H_k}. \quad (9)$$

We have described in detail the calculation of the sensitivity of the push-pull full-bridge magnetic field sensor 50.

In this section, the sensitivity for six related bridge types is stated in a table for comparison without complete derivation. The structure of the bridges is shown in FIGS. 6 through 11. The resulting sensitivity and peak voltage values are summarized in Table 1.

TABLE 1

| Bridge Type | Peak Voltage | Sensitivity | Equation |
|---|---|---|---|
| Full-Bridge 50 | $V_p = \left(\frac{R_H-R_L}{R_H+R_L}\right)V_{bias}$ | $S = \left(\frac{R_H-R_L}{R_H+R_L}\right)\frac{V_{bias}}{H_{cross}-H_k}$ | 10 |
| Referenced Full-Bridge 51 | $V_p = \left(\frac{R_H-R_L}{3R_H+R_L}\right)V_{bias}$ | $S = \left(\frac{R_H-R_L}{3R_H+R_L}\right)\frac{V_{bias}}{H_{cross}-H_k}$ | 11 |

TABLE 1-continued

| Bridge Type | Peak Voltage | Sensitivity | Equation |
|---|---|---|---|
| Half-Bridge 55 | $V_p = \frac{1}{2}\left(\frac{R_H - R_L}{R_H + R_L}\right)V_{bias}$ | $S = \frac{1}{2}\left(\frac{R_H - R_L}{R_H + R_L}\right)\frac{V_{bias}}{H_{cross} - H_k}$ | 12 |
| Referenced Half-Bridge 56 | $V_p = \frac{1}{2}\left(\frac{R_H - R_L}{3R_H + R_L}\right)V_{bias}$ | $S = \frac{1}{2}\left(\frac{R_H - R_L}{3R_H + R_L}\right)\frac{V_{bias}}{H_{cross} - H_k}$ | 13 |
| Push-Pull Quasi-Full-Bridge 57 | $V_p = I_{bias}(R_H - R_L)$ | $S = I_{bias}(R_H - R_L)\frac{V_{bias}}{H_{cross} - H_k}$ | 14 |
| Referenced Quasi-Full-Bridge 58 | $V_p = I_{bias}\frac{(R_H - R_L)}{2}$ | $S = I_{bias}\frac{(R_H - R_L)}{2}\frac{V_{bias}}{H_{cross} - H_k}$ | 15 |

The referenced full-bridge 51 is shown in FIG. 7, with sensing arms (52, 52') and reference arms (53, 53'). Reference arms 53 have no arrow, suggestive of very small slope of its Resistance vs. Applied Magnetic Field curve.

The push-pull full-bridge 50 shown in FIG. 6 has two kinds of sensing arms, (52, 52'), and (54, 54') such that the slope of the R-$H_{sense}$ curves is opposite for 52 and 54. The direction of the arrows over sensing arms 52 and 54 is suggestive of the sign of the slope of their respective Resistance vs. Applied Magnetic Field curves.

One can see in Table 1 that the full-bridge has greater sensitivity than the Referenced Full Bridge because all 4 arms are contributing to the signal.

As shown in FIG. 8, the push-pull half-bridge 55 has two antisymmetrical sensing arms 52, 54, while referenced half-bridge 56 shown in FIG. 9 has only one sensing arm 52 and one reference arm 53.

As shown in FIG. 10 the push-pull quasi-full-bridge, 57, and referenced quasi-full-bridge, 58 has two anti-symmetrical sensing arms 52, 54. It is driven electrically by constant current sources 59 rather than a bias Voltage.

As shown in FIG. 11 the referenced quasi-full-bridge only one sensing arm 52 and a reference arm, 53. It is driven electrically by constant current sources 59 rather than a bias Voltage.

As shown in attached FIGS. 6 and 7, push-pull 50 bridge sensor and the reference bridge sensor 51 connections going around the clockwise direction from the top are: bias voltage (Vbias), the right-side half-bridge center-tap (V2), ground (GND) and right-side half-bridge center-tap (V1). The four connections connect across each bridge arm. They are usually connected to a voltmeter between V1 and V2 to measure the difference (V1-V2), which provides a measure of the bridge circuit output voltage.

As shown in the attached FIG. 8 and FIG. 9 the push-pull half-bridge sensor circuit 55 and the referenced half-bridge sensor circuit 56 have three wire bonding pads: Moving down from the top these are: bias voltage (Vbias), center-tap V1 and the ground (GND).

The output of the push-pull half-bridge sensor circuit 55 and the referenced half-bridge sensor circuit 56 can be measured by various known techniques. One method is to connect a voltmeter between V1 and GND, wherein the potential difference between a V1 and GND (V1−GND) is the output voltage. Another method is to compare V1 and a steady voltage reference $V_{ref}$, wherein the potential difference between V1 and $V_{ref}$ (V1−$V_{ref}$) is the output signal. $V_{ref}$ can be made of a reverse biased diode, a voltage divider or other known methods.

FIGS. 10 and 11 show the push-pull quasi-full-bridge 57 and the referenced full-bridge 58, show three external connectors, where the connections clockwise from the top are: Output voltage tap V2, Ground GND, and output voltage tap V1. Two constant current sources I1 (59) and I2 (59') connect between the voltage taps and GND.

The push-pull quasi-full-bridge 57 and the referenced quasi-full-bridge 58 sensors' output voltages can be measured by many known methods. One method is to use a voltmeter connected to V1 and V2 to measure the difference (V1−V2) which is indicative of the bridge circuit output voltage.

The current sources for push-pull quasi-full-bridge 57 and the referenced quasi-full-bridge 58 sensors' source I1 and I2 can be made up of many known methods. One utilizes a voltage feedback loop to monitor and adjust the voltage of the magnetoresistive elements. Another method is to use a magnetoresistive element in the circuit to control the current. In this method a magnetoresistive element with greater resistance than the sensing or reference arms is used. Here the larger resistance acts to stabilize the current against the change of the bridge arm resistance values, and it is thus like a current source.

In the previous section, the referenced full-bridge 51, referenced half-bridge sensor 56, and the referenced quasi-full-bridge 58 sensors need a "reference arm" (53), which should have very low sensitivity compared to the sensing arms, within the operating field range of the sensor. It is not practical to change ΔR/R of the reference arm with respect to the sensor arm, so sensitivity is most easily adjusted by modifying $H_s$. This may be accomplished by one or a combination of several different techniques:

Magnetic Shielding—Here, a high permeability ferromagnetic plate is deposited over top of the reference arms of the bridge in order to attenuate the applied magnetic field.

Shape anisotropy stabilization—The reference and sensor MR elements have a different size and thus different shape anisotropy. The most general approach would be to make the reference MR elements longer and narrower than the sensor MR elements, such that the demagnetizing factor in the direction parallel to the sensing axis is much larger for the reference MR elements than it is for the sensing MR elements.

Exchange bias—In this technique, an effective field is created in the direction perpendicular to the sensing axis, by exchange coupling the free layer of the MR elements to an adjacent antiferromagnetic or permanent magnet layer. It may be desirable to put a thin spacer layer of a material like Cu or Ta between the freelayer and the layer to which it is exchange biased in order to reduce the strength of the exchange bias. Representative layering sequences are as follows:

. . . Seed/AF1/FM/Ru/FM/barrier/FM/spacer/AF2/cap . . .
   . . . Seed/AF1/FM/Ru/FM/barrier/FM/spacer/PM/cap . . .
   . . . Seed/AF1/FM/Ru/FM/barrier/FM/AF2/cap . . .
   . . . Seed/AF1/FM/Ru/FM/barrier/FM/PM/cap . . .

Here, AF1 and AF2 are antiferromagnetic materials, such as PtMn, IrMn, FeMn. FM is used to represent a ferromagnetic layer or multilayer comprised of many different possible ferromagnetic alloys, including but not limited to NiFe, CoFeB, CoFe, and NiFeCo. The barrier may be any insulating material that is compatible with spin polarized tunneling, such as $Al_2O_3$ or MgO. The spacer is generally a non magnetic layer, usually a thin layer of Ta, Ru or Cu. The different antiferromagnetic layers, AF1 and AF2 would generally be chosen such that the blocking temperature of AF2 is lower than the blocking temperature of AF1, so that the FM/Ru/FM pinning layer can be set in a direction orthogonal to the exchange bias fields created by FM2 on the freelayer.

Magnetic field bias—In this technique, permanent magnet materials, such as alloys of Fe, Co, Cr, and Pt are deposited on the sensor substrate or in the MR stack and used to produce a stray field that biases the MR element transfer curve. An advantage of permanent magnetic biasing is the permanent magnet can be initialized using a large magnetic field, after the bridge is fabricated. A further and very important advantage is the bias field can be used to remove domains from the MR sensor elements in order to stabilize and linearize their response. These advantages provide great flexibility in tuning the design to account for manufacturing variation as will be discussed. For the in-stack design, the following schematic layering sequence is possible . . . Seed/AF1/FM/Ru/FM/barrier/FM/thick-spacer/PM/cap . . .

The other technique involves the use of biasing magnets side-by-side with the MR elements.

The techniques for adjusting sensitivity may be applied individually, or in combination. In particular, it may be desirable to combine several techniques to make $H_{Sat}^{ref}$ extremely high, thereby reducing $S_{MTJ}$ of the reference leg providing a very stable reference arm for the bridge sensor.

Figure 13:
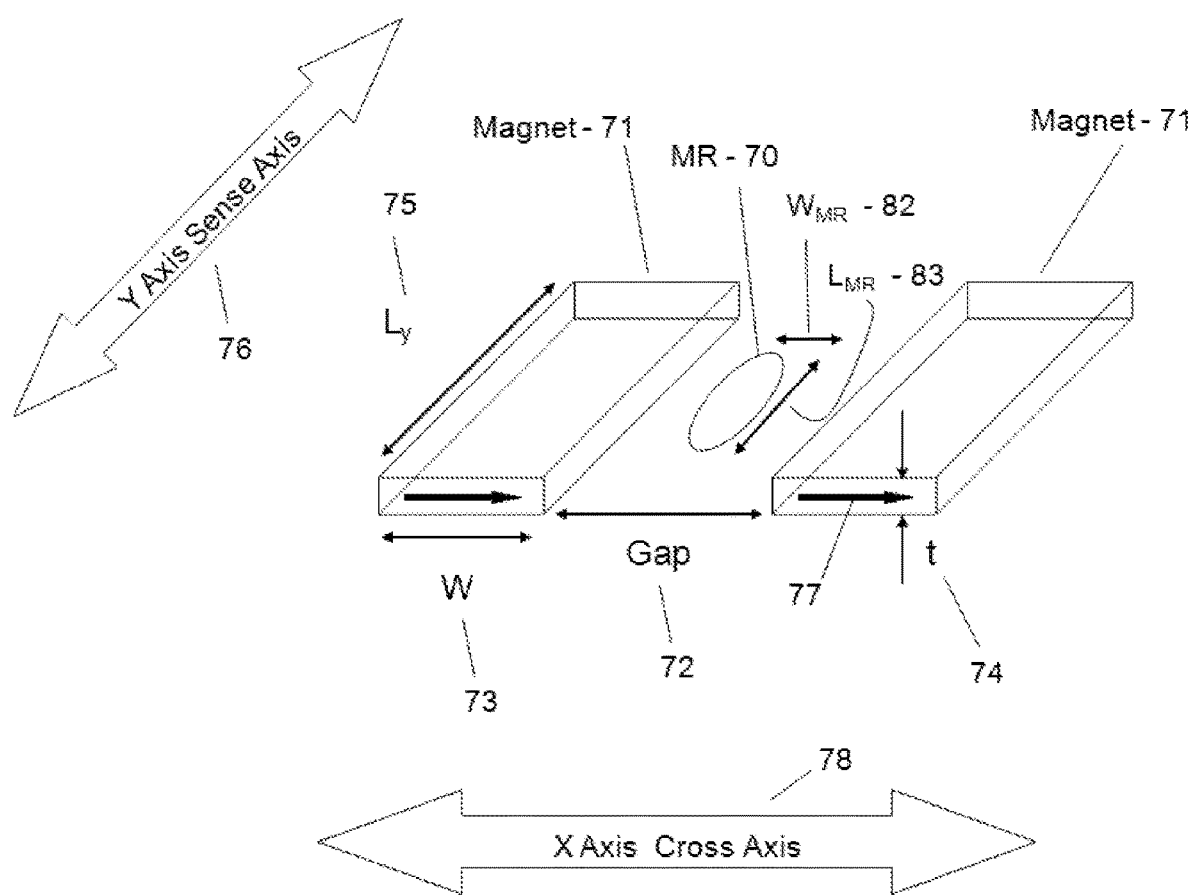
FIG. 13—A drawing illustrating the location of permanent magnets with respect to an MTJ sensor element whose long axis is parallel to the Sense Axis.

Here a preferred method for providing $H_{cross}$ is disclosed. This method is illustrated in FIG. 13. Here, a magnetoresistive sensor 70 is situated between two on-chip magnets 71. The top surface of the underlying semiconductor substrate on which they are formed is not shown for clarity.

The magnets are separated by a "gap" 72; have width "W" 73, thickness "t" 74, and length "$L_y$" 75. The magnets are designed to provide a cross-bias field in the direction perpendicular to the sensitive axis, or Y axis 76 of the bridge sensor, but largely in the plane of the substrate. This axis will be called the Cross Axis or X Axis, 78. Magnetoresistive element, 70, has an elliptical shape having width $W_{MR}$, 82, and length $L_{MR}$, 83. The cross section of MR element 70 is shown in FIG. 1.

Figure 14:
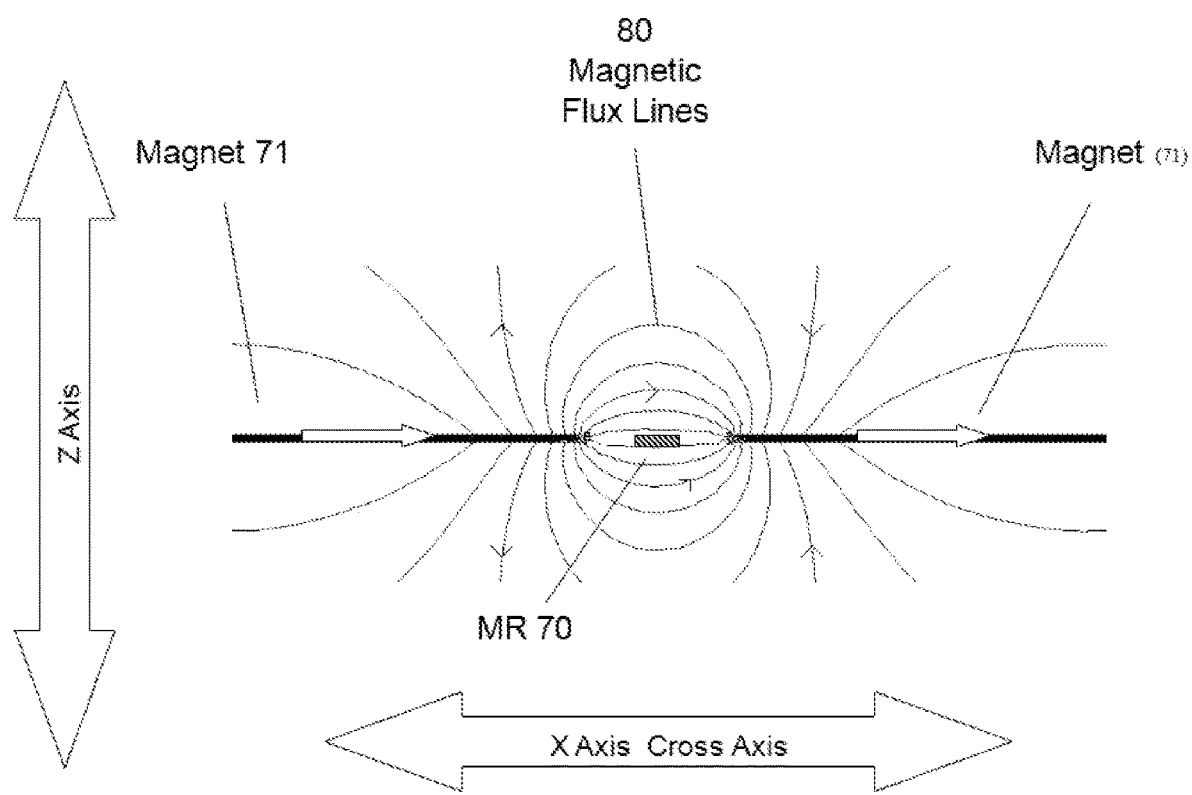
FIG. 14—A cross-section through the permanent magnets and MTJ element shown in FIG. 13, illustrating the pattern of magnetic field lines around a pair of permanent magnetic plates.

The permanent magnets are initialized using a large magnetic field, such that their remanent magnetization $M_{PM}$, 77 is largely perpendicular to the Sense Axis, 76 of the bridge sensor, and largely parallel to the Cross Axis or X axis, 78. Here the X and Y axes are the standard orthogonal Cartesian coordinate axes, the Z axis is normal to the substrate surface. A Y=0 (or X-Z plane) projection of the resulting pattern of magnetic flux lines around the magnets 71 is shown as 80 in FIG. 14. The magnitude and direction of these fields are calculated here.

Figure 16:
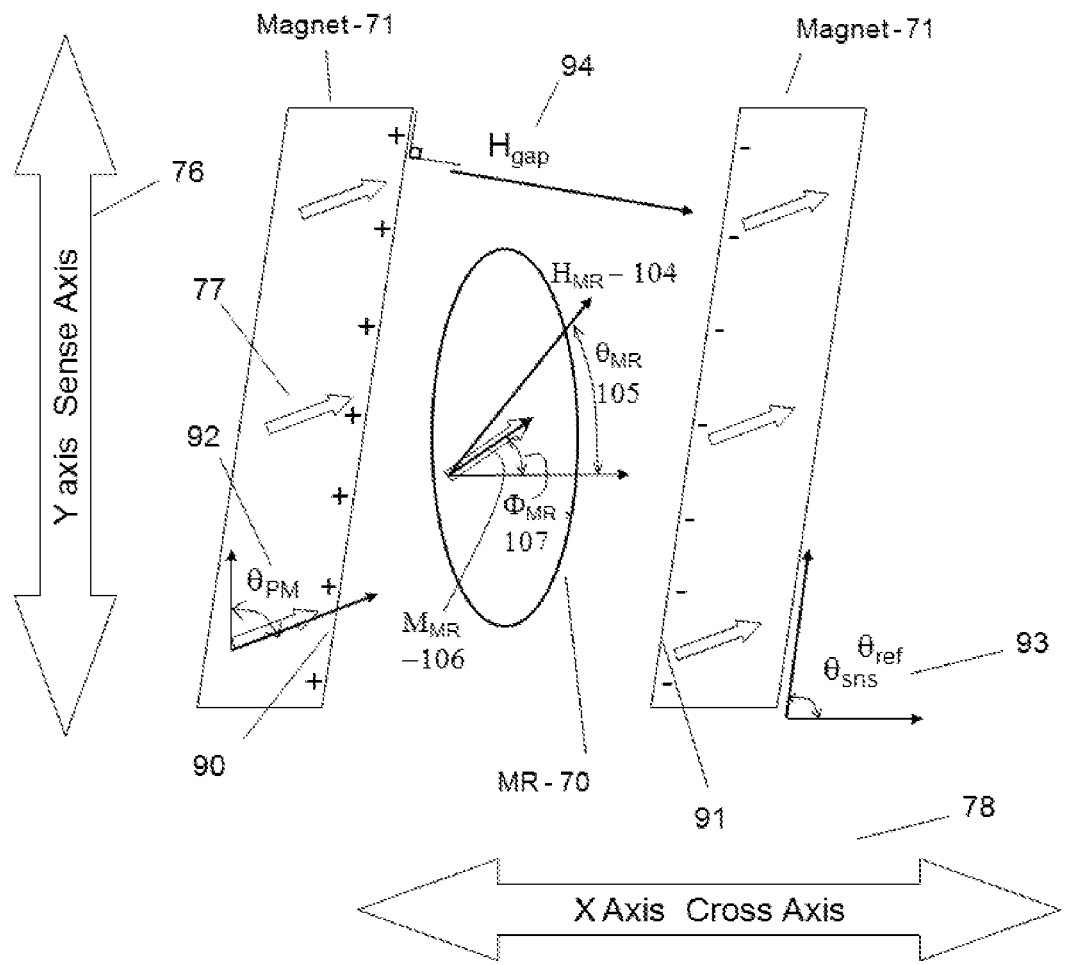
FIG. 16—A drawing illustrating the various angles associated with setting the field strength and orientation at the MTJ element in order to control offset and saturation fields of the MTJ transfer curves.

The field from the permanent magnets can be considered to be due to virtual magnetic charges that form at the edge of the permanent magnet plates as illustrated in FIG. 16 at 90 and 91 as a result of boundary conditions on the magnetization. The orientation of remanent magnetization $M_{PM}$, 77 is set to be at an angle "$\theta_{PM}$" 92 from the Sense Axis. The charges vary with magnitude and orientation "$\theta_{PM}$" 92 of the remanent magnetization $M_{PM}$ 77 with respect to the orientation of the edge of the permanent magnet slab "$\theta_{ref}$" or "$\theta_{sns}$" 93 as $$\rho_s = M_r \cos(\theta_{PM} + \theta_{ref}) \text{ or } \rho_s = M_r \cos(\theta_{PM} + \theta_{sns}) \quad (16)$$

These virtual charges produce a magnetic field according to the standard equation $$\vec{H}(\vec{r}) = 4\pi \int_{Surface} \frac{\rho_s}{(\vec{r} - \vec{r}')^2} dS'. \quad (17)$$

The resulting magnetic field in the gap between the two magnets 71 in the plane of the MR element 70 is indicated in FIG. 16 as the vector $H_{gap}$, 94. It has an orientation that is largely perpendicular to the edge of magnets 71. The same vector is shown as 94', in a vector sum diagram of FIG. 17. One can see from angle addition rules that the angle $\theta_{gap}$ between vector $H_{gap}$, 94, and the X axis is given by $$\theta_{gap} = \theta_{sns} - \pi/2 \text{ or } \theta_{gap} = \theta_{ref} - \pi/2 \quad (18)$$

In the case where $\theta_{PM} = \theta_{ref}$ or $\theta_{ref} = \pi/2$, the magnetic field at the center of the MR element as a function of the remanent magnetization, $M_r$ is given as $$H_{cross} = -8M_r \left( a\tan\left(\frac{L_y t}{\left(\frac{W}{2} - \frac{gap}{2}\right)\sqrt{L_y^2 t^2 \left(\frac{W}{2} - \frac{gap}{2}\right)^2}}\right) + \right.$$
$$\left. a\tan\left(\frac{L_y t}{\left(\frac{W}{2} - \frac{gap}{2}\right)\sqrt{L_y^2 t^2 \left(\frac{W}{2} - \frac{gap}{2}\right)^2}}\right) \right) \quad (19)$$

Figure 15:
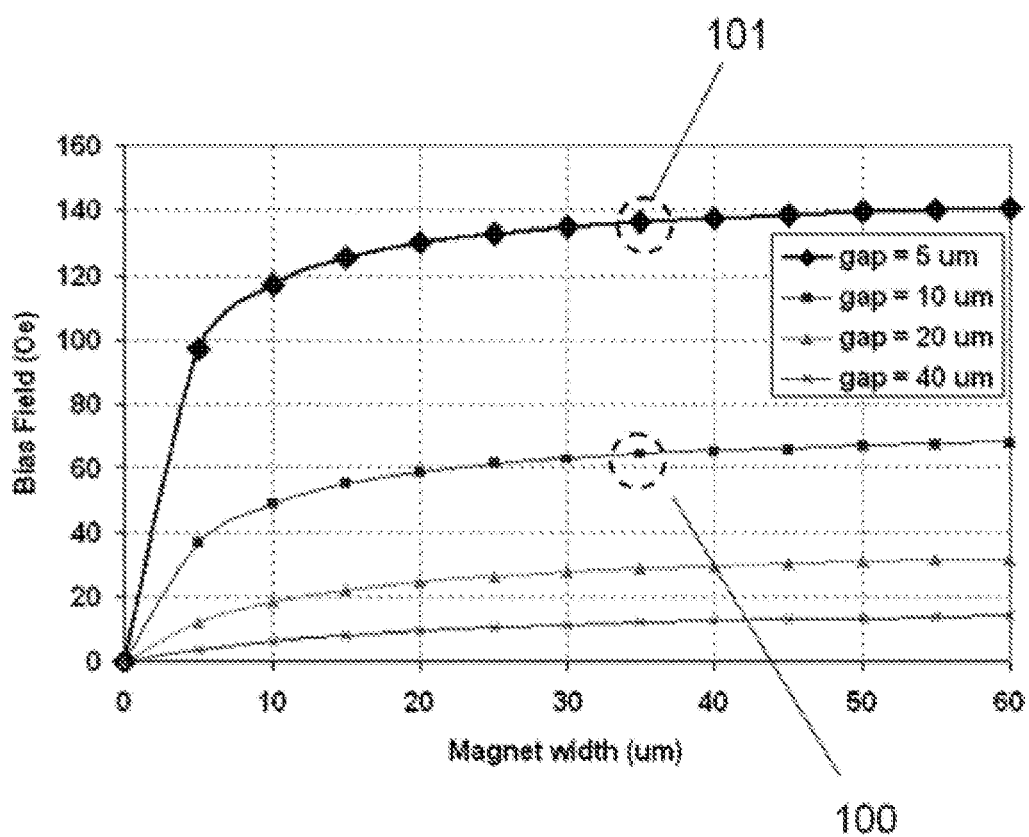
FIG. 15—Magnetic field strength at the center of a pair of permanent magnet plates, where sensing elements would be, as a function of magnet width and magnet-to-magnet gap.

Equation 19 is plotted in FIG. 15 as a function of magnet width W 73 and gap 72 to show how the saturation field of the reference and sensor arms can be varied with respect to each other by changing the dimensions of the permanent magnet structures 71. Here for example, using the same MTJ stack, MTJ element dimensions, and permanent magnet film in the sensor and reference arms, it is possible to get a factor of 6.5 difference in $H_{cross}$ 100 and 101, so that the reference leg saturates at a field 6.5× higher than the sensor leg. This is sufficient for referenced bridges such as referenced full-bridge 51, Referenced half-bridge 56, and referenced quasi-full-bridge 58, in FIG. 5; and it is relatively easy to get differences exceeding a factor of 10 with proper design. For the full-bridge, 50, in FIG. 6, only one set of permanent magnet film dimensions would be needed because there is no "reference sensor" in a full-bridge.

Figure 17:
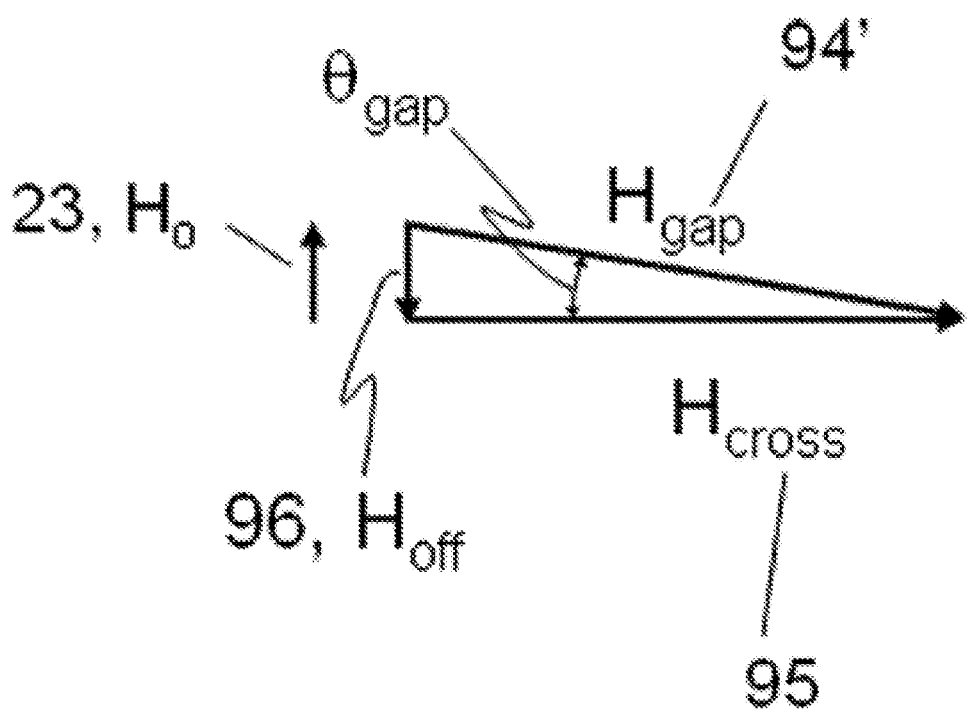
FIG. 17 illustrates the components of the magnetic field associated with the arrangement illustrated in FIG. 16.

The vector sum diagram of FIG. 17 shows the coordinate axis components, $H_{cross}$, 95, and $H_{off}$, 96, of total vector $H_{gap}$ 94'. This shows that it is possible to design the angle of the edges of magnets 71 with respect to the sensing direction to produce both $H_{cross}$ 95 and an offset-canceling field, $H_{off}$ 96, in order to both 1) set the saturation value, and compensate for the offset field $H_o$, 23, of the MR element 70, and 2) optimize the bridge response for symmetry, offset, and sensitivity. Additionally, the ability to set $M_{PM}$ 77 at an angle $\theta_{PM}$, 92 with respect to the Sense Axis, after the device is fabricated, provides the ability to fine tune the device after manufacturing in order to minimize bridge offset or asymmetry. This capability can be used to increase manufacturing yield.

Having completed the description of generating a cross-axis magnetic bias field using on-chip permanent magnets, now is presented the derivation of equation (8) leading to (9) which states the Voltage Sensitivity in terms of magnetoresistive geometry, and ferromagnetic material properties. The magnetic object for which this theory is developed is free layer 6 of the MTJ, having thickness, $T_{MR}$, 11 as shown in FIG. 1. The shape of the MR free layer 6 in the X-Y plane is shown schematically in FIGS. 13 and 16 where MR element 70 has an elliptical outline whose length $L_{MR}$, 83 is longer than its width $W_{MR}$, 82, which are along the Y axis 76 and X axis 78, respectively.

When the MR sensor element operates, it experiences a net externally applied magnetic field, shown in FIG. 16 as vector, $H_{MR}$, 104. This applied field is at an angle to the X axis of $\theta_{MR}$, 105. This induces a net magnetization $M_{MR}$, 106, of the "free layer" 6 of MR element 70. The $M_{MR}$ is at angle $\Phi_{MR}$, 107 to the X axis.

The sensitivity is defined as the slope of the R-$H_{sense}$ curve at field=zero. This will be calculated using this solution method:
1) Find the magnetic free energy of the MR element as a function of $H_{MR}$, $M_{MR}$ of $\theta_{MR}$, and $\Phi_{MR}$.
2) Minimize the energy.
3) Solve for the magnetization angle of $\theta_{MR}$ as a function of applied magnetic field.
4) Take the derivative of the $M_{MR}$ vs. $H_{MR}$ at $H_{MR}$=0 to determine sensitivity at zero applied field.

In order to explain the effect of MR element dimensions on its magnetic behavior, some typical values for $L_{MR}$, $W_{MR}$, and $T_{MR}$ are given as 3,000 nm, 12,000 nm, and 6 nm, respectively for an aspect ratio of 500:2000:1 in [X:Y:Z]. Thus, the demagnetizing factors in this example are $$[d_x, d_y, d_z] \approx [0.0004, 0.0001, 0.9995] \quad (20)$$

The total Energy={Energy due to Applied Field}+{Self Energy}

$$E(\theta) = -\overrightarrow{H_{External}} \cdot \overrightarrow{M} - \frac{1}{2}\overrightarrow{H} \cdot \overrightarrow{M} \quad (21)$$

The self fields in the second term here include two uniaxial fields with constants in X, Y, Z: demagnetizing fields (d), and material anisotropy (k).

$$H_{dx} = -N_x M_x = -(d_x + k_x)M_x \quad (22)$$

$$H_{dy} = -N_y M_y = -(d_y + k_y)M_y \quad (23)$$

$$H_{dz} = -N_z M_z = -(d_z + k_z)M_z \quad (24)$$

Then make some simplifying approximations:
1) The $H_{MR}$ to be sensed is entirely along the Y axis.
2) The $H_{cross}$ is entirely along the X axis.
3) The $M_z$=0 because $d_z >> d_x, d_y$.

Equation 21 then simplifies to:

$$E(\theta) = -H_{cross}M_x - H_{MR}M_y - \frac{1}{2}H_{dx}M_x - \frac{1}{2}H_{dy}M_y. \quad (25)$$

Inserting (22) and (23) into (25), the total energy becomes:

$$E(\theta) = -H_{cross}M_x - H_{MR}M_y + \frac{1}{2}N_x M_x^2 + \frac{1}{2}N_y M_y^2 \quad (26)$$

$$E(\theta) = -H_{cross}M_s\cos(\theta) - \quad (27)$$
$$H_{MR}M_s\sin(\theta) + \frac{1}{2}N_x M_s^2\cos^2(\theta) + \frac{1}{2}N_y M_s^2\sin^2(\theta).$$

$$\frac{1}{M_s^2}E(\theta) = -h_{cross}\cos(\theta) - h_{MR}\sin(\theta) + \frac{N_y - N_x}{2}\sin^2(\theta) + \frac{N_x}{2} \quad (28)$$

Minimize (28) to find the functional dependence of $\theta$:

$$\frac{1}{M_s^2}\frac{\partial E}{\partial \theta}(\theta) = h_{cross}\sin(\theta) - h_y\cos(\theta) + \frac{N_y - N_x}{2}2\sin(\theta)\cos(\theta) = 0 \quad (29)$$

Assume $H_{cross}$ saturates the MR element magnetization, $M_{MR}$, so we can solve in the limit of small $\theta$:

$$h_{cross}\theta - h_{MR} + (N_y - N_x)\theta \approx 0 \quad (30)$$

$$\theta \approx \frac{h_{MR}}{h_{cross} + (N_y - N_x)} = \frac{H_{MR}}{H_{cross} + (N_y - N_x)M_s} = \frac{H_{MR}}{H_{cross} - H_k} \quad (31)$$

Note, the total anisotropy is expressed as:
$$H_k = (N_x - N_y)M_s. \quad (32)$$

Using the small angle approximation:

$$M(\theta) \approx M_s\sin\left(\frac{H_{MR}}{H_{cross} - H_k}\right) \approx \left(\frac{M_s}{H_{cross} - H_k}\right)H_{MR}. \quad (33)$$

The slope at zero field is thus:

$$\frac{\partial M}{\partial H_y}(\theta) \approx \left(\frac{M_s}{H_{cross} - H_k}\right) \quad (34)$$

Assuming a bridge sensor saturates at voltage $V_p$, the sensitivity is $$S = \frac{V_p}{M_s}\frac{\partial M}{\partial H_y}(\theta) \approx \frac{V_p}{M_s}\left(\frac{M_s}{H_{cross} - H_k}\right) = \frac{V_p}{H_{cross} - H_k}. \quad (35)$$

Figure 18:
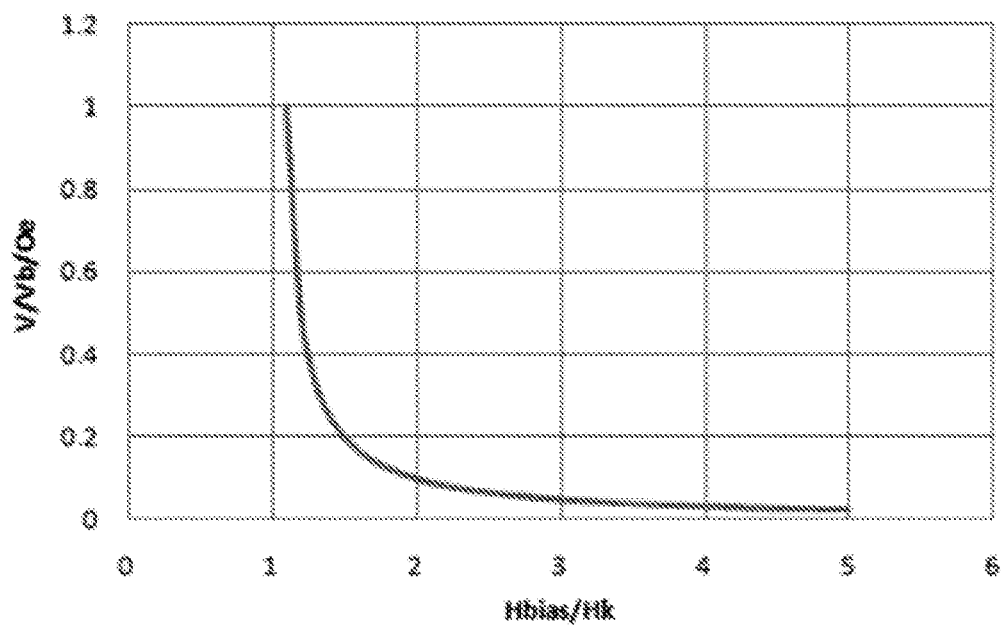
FIG. 18—A plot of calculated Sensitivity vs. $H_{cross}/H_k$.

This is related to the difference between the cross field and the anisotropy field. A plot of Sensitivity (Volts/Volt/Oe) vs. [$H_{cross}/H_k$] (dimensionless) is shown in FIG. 18. One can see that as $H_{cross}/H_k$ decreases towards the value 1, the calculated Sensitivity increases to infinity. In practice, $H_{cross}$ is set to be slightly higher than $H_k$ so that the sensor has a wider range of magnetic fields that it can sense, to reduce magnetic hysteresis, and avoid other undesirable effects of having free layer magnetization $M_{MR}$ not be magnetically saturated.

In large-scale industrial production, the magnetoresistive element is prepared on a round substrate, called the wafer, which is cut into small pieces known as chips or dice. For specific applications one or two magnetoresistive dice may be electrically interconnected to form a bridge, which is then encapsulated.

Figure 19:
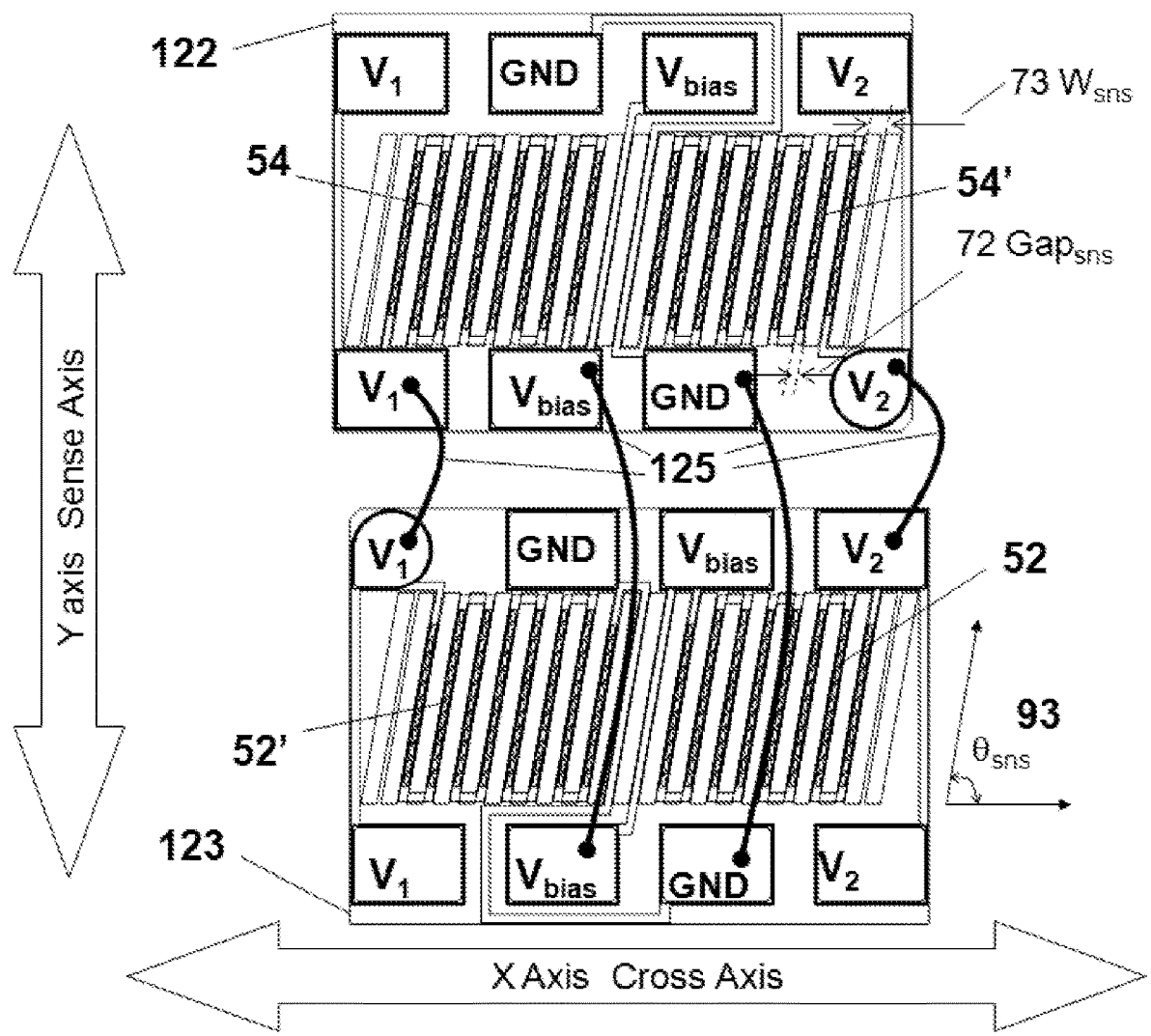
FIG. 19—An exemplary sensor die layout where two dice, each having two sensing arms, are used to form a full bridge with four sensing arms. The two dice are identical, but one is rotated 180 degrees, about the normal axis to the sensor substrate plane, with respect to the other.

FIG. 19 shows an exemplary die layout of a full bridge using the inventive MR sensing elements 70 with the shape shown in FIGS. 16 and 13. Two nominally identical dice, 122 and 123, are placed into the same sensor package. They are rotated precisely 180 degrees from one another about the Z axis, their sensing plane is the X-Y plane. Each die has two electrically isolated MR sensing legs.

The electrical connections needed to form full-bridge 50 are made using wire bonds 125. The wire bond pads are the large rectangles at the edge of each die except one rounded bond pad which helps visually identify the number and orientation of each die's bond pads. Each electrical node on a die has two bond pads (for a total of 8), one for internal bridge connections and one for connecting outside the device. This leaves the wire bond pads at the top of the figure on die 122 available for bonding out to a lead frame or printed circuit board.

On a given die, the long axes of the elements are along the Sense Axis. There are on-chip tilted permanent magnets of width W, 73; and spacing between magnets is Gap 72. These magnets are "tilted" through an angle "$\theta_{sns}$," 93. They provide the magnetic biasing field needed to magnetically saturate the sensing element, when additional $H_{off}$ is needed to meet $H_{off}-H_o>H_{sat}$. This is necessary for a push-pull bridge to operate in a linear state. The full-bridge, 50, is arranged and fabricated on the dice (which have been cut out of the substrate) as follows: Positive sense resistor 52', at the lower left of the two-die arrangement, is connected to GND and $V_1$. Positive sense resistor 52, lower right, is connected to $V_{bias}$ and $V_2$. Both positive sense resistors 52 an 52' have transfer curves with positive slope low R for negative $H_{sense}$. Negative sense resistor 54', in the upper right, is connected between GND and $V_2$. Negative sense resistor 54, upper left, is connected between $V_{bias}$ and $V_1$. Both negative sense resistors 54 and 54' have the shape of transfer curve high R for negative $H_{sense}$.

Figure 20:
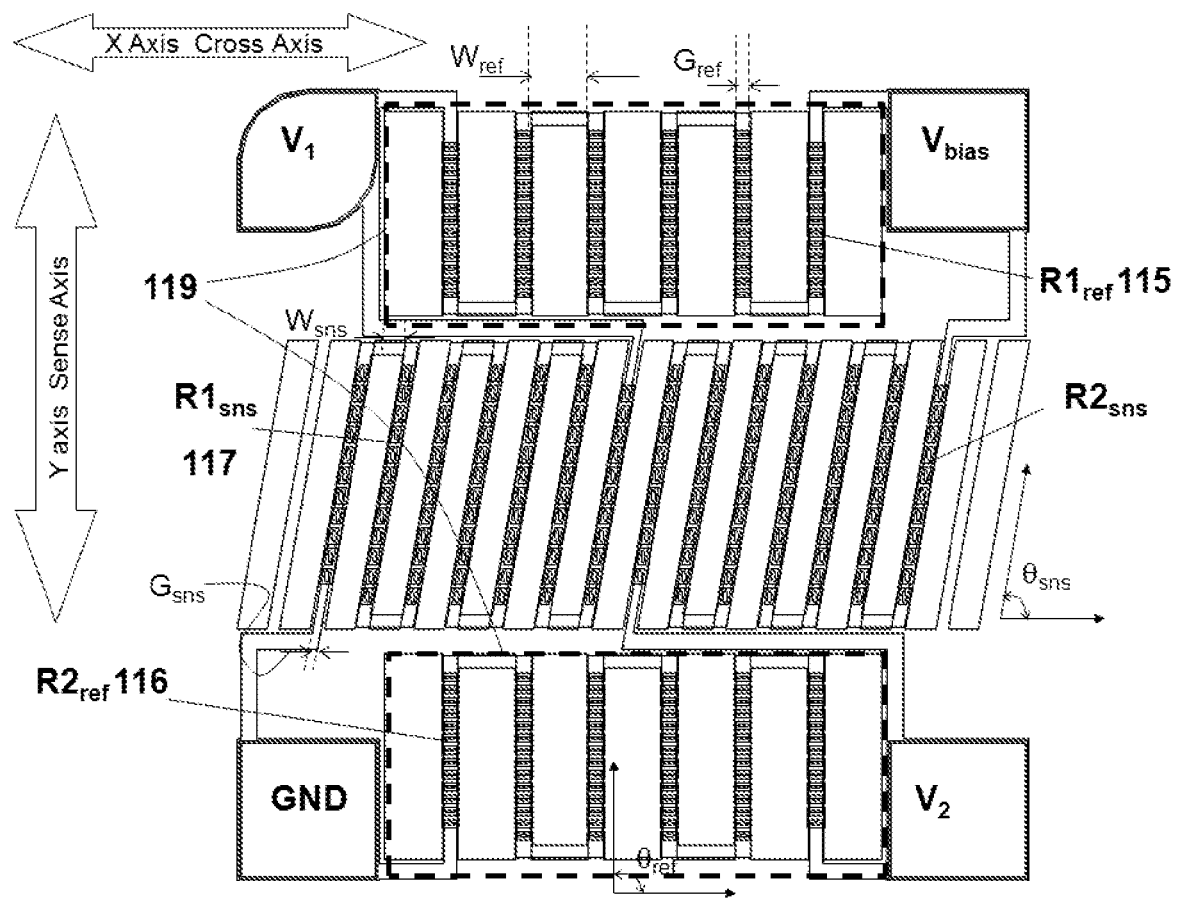
FIG. 20—An exemplary sensor die layout utilizing tilted magnets in order to set sensor arm bias, and straight magnets to set reference arm, to optimize the bridge transfer curve. Optional shields are indicated.

FIG. 20 shows an exemplary die layout using tilted permanent magnets of different widths, angle, and spacing in the reference and sensor arms to produce an optimal referenced full bridge sensor, 51. As shown, the reference arm has a long axis parallel to the X-axis, and it is greater than the length of the sensing arm magnetoresistive element. These sense and reference arms can be deposited in a single step, and then the sensor can be diced, resulting in a truly monolithic sensor design, which can be wire-bonded in to a package. In this design, strings of MTJ elements are situated between permanent magnet slabs that are tilted at different angles in the reference 115, 116 and sensor 117, 118 arm areas of the bridge. In this design, $\theta_{ref}$ is $\pi/2$, and $\theta_{sns}$ in the range between $\pi/4$ to $\pi/2$. Optimization may be accomplished by zeroing the offset of both the reference and sensor arms and adjusting the relative number of MTJ elements in the reference and sensor MTJ strings, or by offsetting only the reference or sensor strings. Rectangular shields, 119, are shown in dashed rectangles; these are optional. The function of shields is to further reduce the effective sensitivity of reference arms 115, and 116.

The remaining sensor layouts share similar design features, and it is not necessary to describe each one in detail here.

The resulting magnetoresistive sensor can be used in various magnetic field measurement applications, and it is easily mass produced. It has higher sensitivity, low power consumption, and can be made in a very small form factor.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

What is claimed is:

1. A magnetoresistive sensor, comprising:
   a first die and a second die, each of the first die and second die including a substrate having a surface parallel to an X-Y plane defined by an X-axis and a Y-axis, wherein the X-axis and Y-axis are perpendicular;
   a bridge sensor configured to provide a bridge response to sense an applied magnetic field along the Y-axis, the bridge sensor including:
      two magnetoresistive arms in a half-bridge configuration with a first of the two magnetoresistive arms on the first die and a second of the two magnetoresistive arms on the second die, or
      four magnetoresistive arms in a full bridge configuration having a first set of two opposing magnetoresistive arms and a second set of two opposing magnetoresistive arms, wherein the first set is on the first die and the second set is on the second die,
      wherein each of the two or four magnetoresistive arms includes electrically-interconnected magnetoresistive sensor elements in the X-Y plane,
      wherein each of the magnetoresistive sensor elements in the bridge sensor is an MTJ or GMR sensor element having:
         a sensing free layer:
         a long dimension parallel to the Y-axis such that the magnetoresistive sensor elements have a sense direction parallel to the Y-axis, wherein the sense direction for the magnetoresistive sensor elements on the first die is opposite the sense direction for the magnetoresistive sensor elements on the second die to provide magnetoresistive response in opposing directions to the applied magnetic field; and
         a shorter width direction parallel to the X-axis,
         a plurality of identically-sized and identically-orientated elongated permanent magnet bars arranged in parallel on the substrate for each of the first die and the second die, the elongated permanent magnet bars for the first die being parallel to the elongated permanent magnet bars for the second die, wherein each of the elongated permanent magnet bars have a long axis and opposing, parallel long sides, wherein the long axes of the elongated magnet bars have identical oblique orientations at an angle with respect to the X-axis of the X-Y plane and thus have identical oblique orientations with respect to the long dimension of the plurality of magnetoresistive sensor elements, wherein at least some of the magnetoresistive sensor elements are between and are magnetically biased with a bias magnetic field by adjacent ones of the elongated permanent magnet bars to improve the bridge response by saturating the at least some of the magnetoresistive sensor elements with an X-axis component ($H_{cross}$) of the bias magnetic field and by offsetting a Neel Coupling ($H_o$) of the at least some of the magnetoresistive sensor elements with a Y-axis component of the bias magnetic field.

2. The magnetoresistive sensor of claim 1, wherein each of the magnetoresistive sensor elements has a transfer curve biased by the X-axis component of the bias magnetic field.

3. The magnetoresistive sensor of claim 1, wherein the first die and the second die are cut from one wafer.

4. The magnetoresistive sensor of claim 3 wherein the first die and the second die are electrically interconnected by wire-bonding to bond pads.

5. The magnetoresistive sensor of claim 1, wherein the bridge sensor is in the full-bridge configuration.

6. A magnetoresistive sensor, comprising:
  a first die and a second die identical to the first die, the first die and the second die being oriented in opposite directions;
  each of the first die and the second die having a surface parallel to an X-Y plane defined by an X-axis and a Y-axis, wherein the X-axis and Y-axis are perpendicular;
  each of the first die and the second die including a plurality of magnetoresistive sensor elements in the X-Y plane identically oriented to have a long axis and a corresponding sense direction parallel to the Y-axis, wherein each of the magnetoresistive sensor elements including an MTJ or GMR sensor element, wherein the sense direction for the magnetoresistive sensor elements on the first die is opposite the sense direction for the magnetoresistive sensor elements on the second die because the first die and the second die are oriented in opposite directions, thereby providing the magnetoresistive sensor elements on the first die with a magnetic response in an opposing direction to magnetic response provided by the magnetoresistive sensor elements on the first die;
  each of the first die and the second die including a plurality of identically-sized and identically-oriented elongated permanent magnets in a parallel arrangement providing equally-spaced gaps between adjacent ones of the elongated permanent magnets, the elongated permanent magnets for the first die being parallel to the elongated permanent magnets for the second die, the elongated permanent magnets having parallel long sides with identical oblique orientations with respect to the X-axis of the X-Y plane and thus having identical oblique orientations with respect to the long axes of the plurality of magnetoresistive sensor elements;
  at least some of the magnetoresistive sensor elements, which have the sense direction parallel to the Y-axis, being within the equally-spaced gaps between adjacent ones of the elongated parallel magnets in the parallel arrangement;
  wherein the magnetoresistive sensor elements on the first die and the second die are electrically-connected to form a bridge sensor having either a full-bridge configuration or a half-bridge configuration,
  the bridge sensor in the full-bridge configuration having four full-bridge arms including a first full-bridge arm electrically connected between a second full-bridge arm and a fourth full-bridge arm, the second full-bridge arm electrically connected between the first full-bridge arm and a third full-bridge arm, the third full-bridge arm electrically connected between the second full-bridge arm and the fourth full-bridge arm, and the fourth full-bridge arm electrically connected between the third full-bridge arm and the first full-bridge arm, wherein for the full-bridge configuration some of the magnetoresistive sensors on the first die are electrically connected to form the first full-bridge arm, some others of the magnetoresistive sensors on the first die are electrically connected to form the full-bridge third arm some of the magnetoresistive sensors on the second die are electrically connected to form the second full-bridge arm, and some others of the magnetoresistive sensors on the second die are electrically connected to form the fourth full-bridge arm, and wherein an electrical connection between one of the first and third full-bridge arms on the first die and one of the second and fourth full-bridge arms on the second die includes wire bonding; and
  the bridge sensor in the half-bridge configuration having two half-bridge arms including a first half-bridge arm electrically connected to a second half-bridge arm, wherein for the half-bridge configuration at least some of the magnetoresistive sensors on the first die are electrically connected to form the first half-bridge arm and at least some of the magnetoresistive sensors on the second die are electrically connected to form the second half-bridge arm, and an electrical connection between the first half-bridge arm on the first die and the second half-bridge arm on the second die includes wire bonding.

* * * * *